US009236466B1

(12) United States Patent  
Lee et al.

(10) Patent No.: US 9,236,466 B1  
(45) Date of Patent: Jan. 12, 2016

(54) ANALOG CIRCUITS HAVING IMPROVED INSULATED GATE TRANSISTORS, AND METHODS THEREFOR

(71) Applicant: MIE Fujitsu Semiconductor Limited, Kuwana (JP)

(72) Inventors: Sang-Soo Lee, Cupertino, CA (US); Heetae Ahn, Cupertino, CA (US); Augustine Kuo, Berkeley, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 125 days.

(21) Appl. No.: 13/646,506

(22) Filed: Oct. 5, 2012

Related U.S. Application Data

(60) Provisional application No. 61/545,006, filed on Oct. 7, 2011, provisional application No. 61/545,014, filed on Oct. 7, 2011.

(51) Int. Cl.  
*H01L 29/78* (2006.01)

(52) U.S. Cl.  
CPC ..................................... *H01L 29/78* (2013.01)

(58) Field of Classification Search  
CPC ....................................................... H01L 29/78  
USPC ................ 331/117 FE; 257/24, 403; 438/291  
See application file for complete search history.

(56) References Cited

U.S. PATENT DOCUMENTS

| 3,958,266 | A | 5/1976 | Athanas |
| 4,000,504 | A | 12/1976 | Berger |
| 4,021,835 | A | 5/1977 | Etoh et al. |
| 4,242,691 | A | 12/1980 | Kotani et al. |
| 4,276,095 | A | 6/1981 | Beilstein, Jr. et al. |
| 4,315,781 | A | 2/1982 | Henderson |
| 4,518,926 | A | 5/1985 | Swanson |
| 4,559,091 | A | 12/1985 | Allen et al. |
| 4,578,128 | A | 3/1986 | Mundt et al. |
| 4,617,066 | A | 10/1986 | Vasudev |
| 4,662,061 | A | 5/1987 | Malhi |
| 4,761,384 | A | 8/1988 | Neppl et al. |
| 4,780,748 | A | 10/1988 | Cunningham et al. |
| 4,819,043 | A | 4/1989 | Yazawa et al. |
| 4,885,477 | A | 12/1989 | Bird et al. |

(Continued)

FOREIGN PATENT DOCUMENTS

| EP | 0274278 A1 | 7/1988 |
| EP | 0312237 A2 | 4/1989 |

(Continued)

OTHER PUBLICATIONS

Banerjee et al., "Compensating Non-Optical Effects using Electrically-Driven Optical Proximity Correction", Proc. of SPIE, vol. 7275, 2009.

(Continued)

*Primary Examiner* — Joseph Chang  
(74) *Attorney, Agent, or Firm* — Baker Botts L.L.P.

(57) ABSTRACT

A circuit can include at least one pair of deeply depleted channel (DDC) transistors having sources commonly coupled to a same current path; and a bias circuit configured to provide bias currents to the drains of the DDC transistors; wherein each DDC transistor includes a source and drain doped to a first conductivity type, a substantially undoped channel region, and a highly doped screening region of the first conductivity type formed below the channel region.

23 Claims, 17 Drawing Sheets

(56) References Cited

U.S. PATENT DOCUMENTS

| | | | |
|---|---|---|---|
| 4,908,681 A | 3/1990 | Nishida et al. | |
| 4,945,254 A | 7/1990 | Robbins | |
| 4,956,311 A | 9/1990 | Liou et al. | |
| 5,034,337 A | 7/1991 | Mosher et al. | |
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |
| 5,208,473 A | 5/1993 | Komori et al. | |
| 5,294,821 A | 3/1994 | Iwamatsu | |
| 5,298,110 A | 3/1994 | Schoenborn et al. | 438/5 |
| 5,298,763 A | 3/1994 | Shen et al. | |
| 5,369,288 A | 11/1994 | Usuki | |
| 5,373,186 A | 12/1994 | Schubert et al. | |
| 5,384,280 A | 1/1995 | Aoki et al. | 438/425 |
| 5,384,476 A | 1/1995 | Nishizawa et al. | |
| 5,405,790 A | 4/1995 | Rahim et al. | |
| 5,426,328 A | 6/1995 | Yilmaz et al. | |
| 5,444,008 A | 8/1995 | Han et al. | |
| 5,552,332 A | 9/1996 | Tseng et al. | |
| 5,559,368 A | 9/1996 | Hu et al. | |
| 5,608,253 A | 3/1997 | Liu et al. | |
| 5,622,880 A | 4/1997 | Burr et al. | |
| 5,624,863 A | 4/1997 | Helm et al. | |
| 5,625,568 A | 4/1997 | Edwards et al. | |
| 5,641,980 A | 6/1997 | Yamaguchi et al. | |
| 5,663,583 A | 9/1997 | Matloubian et al. | |
| 5,712,501 A | 1/1998 | Davies et al. | |
| 5,719,422 A | 2/1998 | Burr et al. | |
| 5,726,488 A | 3/1998 | Watanabe et al. | |
| 5,726,562 A | 3/1998 | Mizuno | |
| 5,731,626 A | 3/1998 | Eaglesham et al. | |
| 5,736,419 A | 4/1998 | Naem | |
| 5,753,555 A | 5/1998 | Hada | |
| 5,754,826 A | 5/1998 | Gamal et al. | |
| 5,756,365 A | 5/1998 | Kakumu | |
| 5,763,921 A | 6/1998 | Okumura et al. | |
| 5,780,899 A | 7/1998 | Hu et al. | |
| 5,847,419 A | 12/1998 | Imai et al. | |
| 5,861,334 A | 1/1999 | Rho | |
| 5,865,003 A | 2/1999 | Klett et al. | |
| 5,877,049 A | 3/1999 | Liu et al. | |
| 5,885,876 A | 3/1999 | Dennen | |
| 5,889,315 A | 3/1999 | Farrenkopf et al. | |
| 5,895,954 A | 4/1999 | Yasamura et al. | |
| 5,899,714 A | 5/1999 | Farrenkopf et al. | |
| 5,918,129 A | 6/1999 | Fulford, Jr. et al. | |
| 5,923,067 A | 7/1999 | Voldman | |
| 5,923,987 A | 7/1999 | Burr | |
| 5,936,868 A | 8/1999 | Hall | |
| 5,946,214 A | 8/1999 | Heavlin | |
| 5,959,504 A | 9/1999 | Wang | |
| 5,985,705 A | 11/1999 | Seliskar | |
| 5,989,963 A | 11/1999 | Luning et al. | |
| 6,001,695 A | 12/1999 | Wu | |
| 6,020,227 A | 2/2000 | Bulucea | |
| 6,043,139 A | 3/2000 | Eaglesham et al. | |
| 6,060,345 A | 5/2000 | Hause et al. | |
| 6,060,364 A | 5/2000 | Maszara et al. | |
| 6,066,533 A | 5/2000 | Yu | |
| 6,072,217 A | 6/2000 | Burr | |
| 6,087,210 A | 7/2000 | Sohn | |
| 6,087,691 A | 7/2000 | Hamamoto | |
| 6,088,518 A | 7/2000 | Hsu | |
| 6,091,286 A | 7/2000 | Blauschild | |
| 6,096,611 A | 8/2000 | Wu | |
| 6,100,770 A | 8/2000 | Litwin et al. | |
| 6,103,562 A | 8/2000 | Son et al. | |
| 6,121,153 A | 9/2000 | Kikkawa | |
| 6,147,383 A | 11/2000 | Kuroda | |
| 6,153,920 A | 11/2000 | Gossmann et al. | |
| 6,157,073 A | 12/2000 | Lehongres | |
| 6,175,582 B1 | 1/2001 | Naito et al. | |
| 6,184,112 B1 | 2/2001 | Maszara et al. | |
| 6,190,979 B1 | 2/2001 | Radens et al. | |
| 6,194,259 B1 | 2/2001 | Nayak et al. | |
| 6,198,157 B1 | 3/2001 | Ishida et al. | |
| 6,218,892 B1 | 4/2001 | Soumyanath et al. | |
| 6,218,895 B1 | 4/2001 | De et al. | |
| 6,221,724 B1 | 4/2001 | Yu et al. | |
| 6,229,188 B1 | 5/2001 | Aoki et al. | |
| 6,232,164 B1 | 5/2001 | Tsai et al. | |
| 6,235,597 B1 | 5/2001 | Miles | |
| 6,245,618 B1 | 6/2001 | An et al. | |
| 6,268,640 B1 | 7/2001 | Park et al. | |
| 6,271,070 B2 | 8/2001 | Kotani et al. | |
| 6,271,551 B1 | 8/2001 | Schmitz et al. | |
| 6,288,429 B1 | 9/2001 | Iwata et al. | |
| 6,297,132 B1 | 10/2001 | Zhang et al. | |
| 6,300,177 B1 | 10/2001 | Sundaresan et al. | |
| 6,313,489 B1 | 11/2001 | Letavic et al. | |
| 6,319,799 B1 | 11/2001 | Ouyang et al. | |
| 6,320,222 B1 | 11/2001 | Forbes et al. | |
| 6,323,525 B1 | 11/2001 | Noguchi et al. | |
| 6,326,666 B1 | 12/2001 | Bernstein et al. | |
| 6,335,233 B1 | 1/2002 | Cho et al. | |
| 6,358,806 B1 | 3/2002 | Puchner | |
| 6,380,019 B1 | 4/2002 | Yu et al. | |
| 6,391,752 B1 | 5/2002 | Colinge et al. | |
| 6,407,412 B1 | 6/2002 | Iniewski et al. | |
| 6,426,260 B1 | 7/2002 | Hshieh | |
| 6,426,279 B1 * | 7/2002 | Huster et al. | 438/528 |
| 6,432,754 B1 | 8/2002 | Assaderaghi et al. | |
| 6,444,550 B1 | 9/2002 | Hao et al. | |
| 6,444,551 B1 | 9/2002 | Ku et al. | |
| 6,449,749 B1 | 9/2002 | Stine | |
| 6,461,920 B1 | 10/2002 | Shirahata | |
| 6,461,928 B2 | 10/2002 | Rodder | |
| 6,472,278 B1 | 10/2002 | Marshall et al. | |
| 6,482,714 B1 | 11/2002 | Hieda et al. | |
| 6,489,224 B1 | 12/2002 | Burr | |
| 6,492,232 B1 | 12/2002 | Tang et al. | |
| 6,500,739 B1 | 12/2002 | Wang et al. | |
| 6,503,801 B1 | 1/2003 | Rouse et al. | |
| 6,503,805 B2 | 1/2003 | Wang et al. | |
| 6,506,640 B1 | 1/2003 | Ishida et al. | |
| 6,518,623 B1 | 2/2003 | Oda et al. | |
| 6,521,470 B1 | 2/2003 | Lin et al. | |
| 6,534,373 B1 | 3/2003 | Yu | |
| 6,541,328 B2 | 4/2003 | Whang et al. | |
| 6,541,829 B2 | 4/2003 | Nishinohara et al. | |
| 6,548,842 B1 | 4/2003 | Bulucea et al. | |
| 6,551,885 B1 | 4/2003 | Yu | |
| 6,552,377 B1 | 4/2003 | Yu | |
| 6,573,129 B2 | 6/2003 | Hoke et al. | |
| 6,576,535 B2 | 6/2003 | Drobny et al. | |
| 6,600,200 B1 | 7/2003 | Lustig et al. | |
| 6,620,671 B1 | 9/2003 | Wang et al. | |
| 6,624,488 B1 | 9/2003 | Kim | |
| 6,627,473 B1 | 9/2003 | Oikawa et al. | |
| 6,630,710 B1 | 10/2003 | Augusto | |
| 6,660,605 B1 | 12/2003 | Liu | |
| 6,662,350 B2 | 12/2003 | Fried et al. | |
| 6,667,200 B2 | 12/2003 | Sohn et al. | |
| 6,670,260 B1 | 12/2003 | Yu et al. | |
| 6,693,333 B1 | 2/2004 | Yu | |
| 6,730,568 B2 | 5/2004 | Sohn | |
| 6,737,724 B2 | 5/2004 | Hieda et al. | |
| 6,743,291 B2 | 6/2004 | Ang et al. | |
| 6,743,684 B2 | 6/2004 | Liu | |
| 6,751,519 B1 | 6/2004 | Satya et al. | |
| 6,753,230 B2 | 6/2004 | Sohn et al. | |
| 6,760,900 B2 | 7/2004 | Rategh et al. | |
| 6,770,944 B2 | 8/2004 | Nishinohara et al. | |
| 6,787,424 B1 | 9/2004 | Yu | |
| 6,797,553 B2 | 9/2004 | Adkisson et al. | |
| 6,797,602 B1 | 9/2004 | Kluth et al. | |
| 6,797,994 B1 | 9/2004 | Hoke et al. | |
| 6,808,004 B2 | 10/2004 | Kamm et al. | |
| 6,808,994 B1 | 10/2004 | Wang | |
| 6,813,750 B2 | 11/2004 | Usami et al. | |
| 6,821,825 B2 | 11/2004 | Todd et al. | |
| 6,821,852 B2 | 11/2004 | Rhodes | |
| 6,822,297 B2 | 11/2004 | Nandakumar et al. | |

(56) References Cited

U.S. PATENT DOCUMENTS

| | | | |
|---|---|---|---|
| 6,831,292 B2 | 12/2004 | Currie et al. | |
| 6,835,639 B2 | 12/2004 | Rotondaro et al. | |
| 6,852,602 B2 | 2/2005 | Kanzawa et al. | |
| 6,852,603 B2 | 2/2005 | Chakravarthi et al. | |
| 6,881,641 B2 | 4/2005 | Wieczorek et al. | |
| 6,881,987 B2 | 4/2005 | Sohn | |
| 6,891,439 B2 | 5/2005 | Jachne et al. | |
| 6,893,947 B2 | 5/2005 | Martinez et al. | |
| 6,900,519 B2 | 5/2005 | Cantell et al. | |
| 6,901,564 B2 | 5/2005 | Stine et al. | |
| 6,916,698 B2 | 7/2005 | Mocuta et al. | |
| 6,917,237 B1 | 7/2005 | Tschanz et al. | |
| 6,927,463 B2 | 8/2005 | Iwata et al. | |
| 6,928,128 B1 | 8/2005 | Sidiropoulos | |
| 6,930,007 B2 | 8/2005 | Bu et al. | |
| 6,930,360 B2 | 8/2005 | Yamauchi et al. | |
| 6,949,440 B2 | 9/2005 | Gau | |
| 6,957,163 B2 | 10/2005 | Ando | |
| 6,958,281 B2 | 10/2005 | Kwon | 438/401 |
| 6,963,090 B2 | 11/2005 | Passlack et al. | |
| 6,979,625 B1 | 12/2005 | Woo et al. | 438/309 |
| 6,995,397 B2 | 2/2006 | Yamashita et al. | |
| 7,002,214 B1 | 2/2006 | Boyd et al. | |
| 7,008,836 B2 | 3/2006 | Algotsson et al. | |
| 7,013,359 B1 | 3/2006 | Li | |
| 7,015,546 B2 | 3/2006 | Herr et al. | |
| 7,015,741 B2 | 3/2006 | Tschanz et al. | |
| 7,022,559 B2 | 4/2006 | Barnak et al. | |
| 7,036,098 B2 | 4/2006 | Eleyan et al. | |
| 7,038,258 B2 | 5/2006 | Liu et al. | |
| 7,039,881 B2 | 5/2006 | Regan | |
| 7,045,456 B2 | 5/2006 | Murto et al. | |
| 7,057,216 B2 | 6/2006 | Ouyang et al. | |
| 7,061,058 B2 | 6/2006 | Chakravarthi et al. | |
| 7,064,039 B2 | 6/2006 | Liu | |
| 7,064,399 B2 | 6/2006 | Babcock et al. | |
| 7,071,103 B2 | 7/2006 | Chan et al. | |
| 7,078,325 B2 | 7/2006 | Curello et al. | |
| 7,078,776 B2 | 7/2006 | Nishinohara et al. | |
| 7,089,513 B2 | 8/2006 | Bard et al. | |
| 7,089,515 B2 | 8/2006 | Hanafi et al. | |
| 7,091,093 B1 | 8/2006 | Noda et al. | |
| 7,105,399 B1 | 9/2006 | Dakshina-Murthy et al. | |
| 7,109,099 B2 | 9/2006 | Tan et al. | |
| 7,119,381 B2 | 10/2006 | Passlack | |
| 7,122,411 B2 | 10/2006 | Mouli | |
| 7,127,687 B1 | 10/2006 | Signore | |
| 7,132,323 B2 | 11/2006 | Haensch et al. | |
| 7,169,675 B2 | 1/2007 | Tan et al. | |
| 7,170,120 B2 | 1/2007 | Datta et al. | |
| 7,176,137 B2 | 2/2007 | Perng et al. | |
| 7,186,598 B2 | 3/2007 | Yamauchi et al. | |
| 7,189,627 B2 | 3/2007 | Wu et al. | |
| 7,199,430 B2 | 4/2007 | Babcock et al. | |
| 7,202,517 B2 | 4/2007 | Dixit et al. | |
| 7,208,354 B2 | 4/2007 | Bauer | |
| 7,211,871 B2 | 5/2007 | Cho | |
| 7,221,021 B2 | 5/2007 | Wu et al. | |
| 7,223,646 B2 | 5/2007 | Miyashita et al. | |
| 7,226,833 B2 | 6/2007 | White et al. | |
| 7,226,843 B2 | 6/2007 | Weber et al. | |
| 7,230,680 B2 | 6/2007 | Fujisawa et al. | |
| 7,235,822 B2 | 6/2007 | Li | |
| 7,256,639 B1 | 8/2007 | Koniaris et al. | |
| 7,259,428 B2 | 8/2007 | Inaba | |
| 7,260,562 B2 | 8/2007 | Czajkowski et al. | |
| 7,294,877 B2 | 11/2007 | Rueckes et al. | |
| 7,297,994 B2 | 11/2007 | Wieczorek et al. | |
| 7,301,208 B2 | 11/2007 | Handa et al. | |
| 7,304,350 B2 | 12/2007 | Misaki | |
| 7,307,471 B2 | 12/2007 | Gammie et al. | |
| 7,312,500 B2 | 12/2007 | Miyashita et al. | |
| 7,323,754 B2 | 1/2008 | Ema et al. | |
| 7,332,439 B2 | 2/2008 | Lindert et al. | |
| 7,348,629 B2 | 3/2008 | Chu et al. | |
| 7,354,833 B2 | 4/2008 | Liaw | |
| 7,380,225 B2 | 5/2008 | Joshi et al. | |
| 7,398,497 B2 | 7/2008 | Sato et al. | |
| 7,402,207 B1 | 7/2008 | Besser et al. | |
| 7,402,872 B2 | 7/2008 | Murthy et al. | |
| 7,416,605 B2 | 8/2008 | Zollner et al. | |
| 7,427,788 B2 | 9/2008 | Li et al. | |
| 7,442,971 B2 | 10/2008 | Wirbeleit et al. | |
| 7,449,733 B2 | 11/2008 | Inaba et al. | |
| 7,462,908 B2 | 12/2008 | Bol et al. | |
| 7,469,164 B2 | 12/2008 | Du-Nour | |
| 7,470,593 B2 | 12/2008 | Rouh et al. | |
| 7,485,536 B2 | 2/2009 | Jin et al. | |
| 7,487,474 B2 | 2/2009 | Ciplickas et al. | |
| 7,491,988 B2 | 2/2009 | Tolchinsky et al. | |
| 7,494,861 B2 | 2/2009 | Chu et al. | |
| 7,496,862 B2 | 2/2009 | Chang et al. | |
| 7,496,867 B2 | 2/2009 | Turner et al. | |
| 7,498,637 B2 | 3/2009 | Yamaoka et al. | |
| 7,501,324 B2 | 3/2009 | Babcock et al. | |
| 7,503,020 B2 | 3/2009 | Allen et al. | |
| 7,507,999 B2 | 3/2009 | Kusumoto et al. | |
| 7,514,766 B2 | 4/2009 | Yoshida | |
| 7,521,323 B2 | 4/2009 | Surdeanu et al. | |
| 7,531,393 B2 | 5/2009 | Doyle et al. | |
| 7,531,836 B2 | 5/2009 | Liu et al. | |
| 7,538,364 B2 | 5/2009 | Twynam | |
| 7,538,412 B2 | 5/2009 | Schulze et al. | |
| 7,562,233 B1 | 7/2009 | Sheng et al. | |
| 7,564,105 B2 | 7/2009 | Chi et al. | |
| 7,566,600 B2 | 7/2009 | Mouli | |
| 7,569,456 B2 | 8/2009 | Ko et al. | |
| 7,586,322 B1 | 9/2009 | Xu et al. | |
| 7,592,241 B2 | 9/2009 | Takao | |
| 7,595,243 B1 | 9/2009 | Bulucea et al. | |
| 7,598,142 B2 | 10/2009 | Ranade et al. | |
| 7,605,041 B2 | 10/2009 | Ema et al. | |
| 7,605,060 B2 | 10/2009 | Meunier-Beillard et al. | |
| 7,605,429 B2 | 10/2009 | Bernstein et al. | |
| 7,608,496 B2 | 10/2009 | Chu | |
| 7,615,802 B2 | 11/2009 | Elpelt et al. | |
| 7,622,341 B2 | 11/2009 | Chudzik et al. | |
| 7,638,380 B2 | 12/2009 | Pearce | |
| 7,642,140 B2 | 1/2010 | Bae et al. | |
| 7,644,377 B1 | 1/2010 | Saxe et al. | |
| 7,645,665 B2 | 1/2010 | Kubo et al. | |
| 7,651,920 B2 | 1/2010 | Siprak | |
| 7,655,523 B2 | 2/2010 | Babcock et al. | |
| 7,673,273 B2 | 3/2010 | Madurawae et al. | |
| 7,675,126 B2 | 3/2010 | Cho | |
| 7,675,317 B2 | 3/2010 | Perisetty | |
| 7,678,638 B2 | 3/2010 | Chu et al. | |
| 7,681,628 B2 | 3/2010 | Joshi et al. | |
| 7,682,887 B2 | 3/2010 | Dokumaci et al. | |
| 7,682,919 B2 | 3/2010 | Johansson | |
| 7,683,442 B1 | 3/2010 | Burr et al. | |
| 7,696,000 B2 | 4/2010 | Liu et al. | |
| 7,700,453 B2 | 4/2010 | Coolbaugh et al. | |
| 7,704,822 B2 | 4/2010 | Jeong | |
| 7,704,844 B2 | 4/2010 | Zhu et al. | |
| 7,709,828 B2 | 5/2010 | Braithwaite et al. | |
| 7,714,412 B2 | 5/2010 | Coolbaugh et al. | |
| 7,723,750 B2 | 5/2010 | Zhu et al. | |
| 7,737,472 B2 | 6/2010 | Kondo et al. | |
| 7,741,138 B2 | 6/2010 | Cho | |
| 7,741,200 B2 | 6/2010 | Cho et al. | |
| 7,745,270 B2 | 6/2010 | Shah et al. | |
| 7,750,374 B2 | 7/2010 | Capasso et al. | |
| 7,750,381 B2 | 7/2010 | Hokazono et al. | |
| 7,750,405 B2 | 7/2010 | Nowak | |
| 7,750,682 B2 | 7/2010 | Bernstein et al. | |
| 7,755,144 B2 | 7/2010 | Li et al. | |
| 7,755,146 B2 | 7/2010 | Helm et al. | |
| 7,759,206 B2 | 7/2010 | Luo et al. | |
| 7,759,714 B2 | 7/2010 | Itoh et al. | |
| 7,761,820 B2 | 7/2010 | Berger et al. | |
| 7,795,677 B2 | 9/2010 | Bangsaruntip et al. | |
| 7,808,045 B2 | 10/2010 | Kawahara et al. | |
| 7,808,410 B2 | 10/2010 | Kim et al. | |

(56) References Cited

U.S. PATENT DOCUMENTS

| | | | |
|---|---|---|---|
| 7,811,873 B2 | 10/2010 | Mochizuki | |
| 7,811,881 B2 | 10/2010 | Cheng et al. | |
| 7,818,702 B2 | 10/2010 | Mandelman et al. | |
| 7,821,066 B2 | 10/2010 | Lebby et al. | |
| 7,829,402 B2 | 11/2010 | Matocha et al. | |
| 7,831,873 B1 | 11/2010 | Trimberger et al. | |
| 7,846,822 B2 | 12/2010 | Seebauer et al. | |
| 7,855,118 B2 | 12/2010 | Hoentschel et al. | |
| 7,859,013 B2 | 12/2010 | Chen et al. | |
| 7,863,163 B2 | 1/2011 | Bauer | |
| 7,867,835 B2 | 1/2011 | Lee et al. | |
| 7,883,977 B2 | 2/2011 | Babcock et al. | |
| 7,888,205 B2 | 2/2011 | Herner et al. | |
| 7,888,747 B2 | 2/2011 | Hokazono | |
| 7,895,546 B2 | 2/2011 | Lahner et al. | |
| 7,897,495 B2 | 3/2011 | Ye et al. | |
| 7,906,413 B2 | 3/2011 | Cardone et al. | |
| 7,906,813 B2 | 3/2011 | Kato | |
| 7,910,419 B2 | 3/2011 | Fenouillet-Beranger et al. | |
| 7,919,791 B2 | 4/2011 | Flynn et al. | |
| 7,926,018 B2 | 4/2011 | Moroz et al. | |
| 7,935,984 B2 | 5/2011 | Nakano | |
| 7,941,776 B2 | 5/2011 | Majumder et al. | |
| 7,945,800 B2 | 5/2011 | Gomm et al. | |
| 7,948,008 B2 | 5/2011 | Liu et al. | |
| 7,952,147 B2 | 5/2011 | Ueno et al. | |
| 7,960,232 B2 | 6/2011 | King et al. | |
| 7,960,238 B2 | 6/2011 | Kohli et al. | |
| 7,968,400 B2 | 6/2011 | Cai | |
| 7,968,411 B2 | 6/2011 | Williford | |
| 7,968,440 B2 | 6/2011 | Seebauer | |
| 7,968,459 B2 | 6/2011 | Bedell et al. | |
| 7,989,900 B2 | 8/2011 | Haensch et al. | |
| 7,994,573 B2 | 8/2011 | Pan | |
| 8,004,024 B2 | 8/2011 | Furukawa et al. | |
| 8,012,827 B2 | 9/2011 | Yu et al. | |
| 8,029,620 B2 | 10/2011 | Kim et al. | |
| 8,039,332 B2 | 10/2011 | Bernard et al. | |
| 8,046,598 B2 | 10/2011 | Lee | |
| 8,048,791 B2 | 11/2011 | Hargrove et al. | |
| 8,048,810 B2 | 11/2011 | Tsai et al. | |
| 8,051,340 B2 | 11/2011 | Cranford, Jr. et al. | |
| 8,053,340 B2 | 11/2011 | Colombeau et al. | |
| 8,063,466 B2 | 11/2011 | Kurita | |
| 8,067,279 B2 | 11/2011 | Sadra et al. | |
| 8,067,280 B2 | 11/2011 | Wang et al. | |
| 8,067,302 B2 | 11/2011 | Li | |
| 8,076,719 B2 | 12/2011 | Zeng et al. | |
| 8,097,529 B2 | 1/2012 | Krull et al. | |
| 8,103,983 B2 | 1/2012 | Agarwal et al. | |
| 8,105,891 B2 | 1/2012 | Yeh et al. | |
| 8,106,424 B2 | 1/2012 | Schruefer | |
| 8,106,481 B2 | 1/2012 | Rao | |
| 8,110,487 B2 | 2/2012 | Griebenow et al. | |
| 8,114,761 B2 | 2/2012 | Mandrekar et al. | |
| 8,119,482 B2 | 2/2012 | Bhalla et al. | |
| 8,120,069 B2 | 2/2012 | Hynecek | |
| 8,129,246 B2 | 3/2012 | Babcock et al. | |
| 8,129,797 B2 | 3/2012 | Chen et al. | |
| 8,134,159 B2 | 3/2012 | Hokazono | |
| 8,134,418 B2 | 3/2012 | Jiang | |
| 8,143,120 B2 | 3/2012 | Kerr et al. | |
| 8,143,124 B2 | 3/2012 | Challa et al. | |
| 8,143,678 B2 | 3/2012 | Kim et al. | |
| 8,148,774 B2 | 4/2012 | Mori et al. | |
| 8,163,619 B2 | 4/2012 | Yang et al. | |
| 8,169,002 B2 | 5/2012 | Chang et al. | |
| 8,170,857 B2 | 5/2012 | Joshi et al. | |
| 8,173,499 B2 | 5/2012 | Chung et al. | |
| 8,173,502 B2 | 5/2012 | Yan et al. | |
| 8,176,461 B1 | 5/2012 | Trimberger | |
| 8,178,430 B2 | 5/2012 | Kim et al. | |
| 8,179,530 B2 | 5/2012 | Levy et al. | |
| 8,183,096 B2 | 5/2012 | Wirbeleit | |
| 8,183,107 B2 | 5/2012 | Mathur et al. | |
| 8,185,865 B2 | 5/2012 | Gupta et al. | |
| 8,187,959 B2 | 5/2012 | Pawlak et al. | |
| 8,188,542 B2 | 5/2012 | Yoo et al. | |
| 8,196,545 B2 | 6/2012 | Kurosawa | |
| 8,201,122 B2 | 6/2012 | Dewey, III et al. | |
| 8,214,190 B2 | 7/2012 | Joshi et al. | |
| 8,217,423 B2 | 7/2012 | Liu et al. | |
| 8,225,255 B2 | 7/2012 | Ouyang et al. | |
| 8,227,307 B2 | 7/2012 | Chen et al. | |
| 8,236,661 B2 | 8/2012 | Dennard et al. | |
| 8,239,803 B2 | 8/2012 | Kobayashi | |
| 8,242,581 B1 | 8/2012 | Ratnakumar et al. | |
| 8,247,300 B2 | 8/2012 | Babcock et al. | |
| 8,255,843 B2 | 8/2012 | Chen et al. | |
| 8,258,026 B2 | 9/2012 | Bulucea | |
| 8,266,567 B2 | 9/2012 | El Yahyaoui et al. | |
| 8,273,616 B2 | 9/2012 | Chen et al. | |
| 8,286,180 B2 | 10/2012 | Foo | |
| 8,288,798 B2 | 10/2012 | Passlack | |
| 8,299,562 B2 | 10/2012 | Li et al. | |
| 8,324,059 B2 | 12/2012 | Guo et al. | |
| 8,334,571 B2 | 12/2012 | Tsai et al. | |
| 2001/0014495 A1 | 8/2001 | Yu | |
| 2002/0042184 A1 | 4/2002 | Nandakumar et al. | |
| 2002/0097405 A1 | 7/2002 | Kishimura | 356/625 |
| 2003/0006415 A1 | 1/2003 | Yokogawa et al. | |
| 2003/0047763 A1 | 3/2003 | Hieda et al. | |
| 2003/0122203 A1 | 7/2003 | Nishinohara et al. | |
| 2003/0173626 A1 | 9/2003 | Burr | |
| 2003/0183856 A1 | 10/2003 | Wieczorek et al. | |
| 2003/0215992 A1 | 11/2003 | Sohn et al. | |
| 2004/0075118 A1 | 4/2004 | Heinemann et al. | |
| 2004/0075143 A1 | 4/2004 | Bae et al. | |
| 2004/0084731 A1 | 5/2004 | Matsuda et al. | |
| 2004/0087090 A1 | 5/2004 | Grudowski et al. | |
| 2004/0126947 A1 | 7/2004 | Sohn | |
| 2004/0175893 A1 | 9/2004 | Vatus et al. | |
| 2004/0180488 A1 | 9/2004 | Lee | |
| 2004/0189407 A1* | 9/2004 | Manna et al. | 331/57 |
| 2005/0106824 A1 | 5/2005 | Alberto et al. | |
| 2005/0116282 A1 | 6/2005 | Pattanayak et al. | |
| 2005/0250289 A1 | 11/2005 | Babcock et al. | |
| 2005/0280075 A1 | 12/2005 | Ema et al. | |
| 2006/0022270 A1 | 2/2006 | Boyd et al. | |
| 2006/0049464 A1 | 3/2006 | Rao | |
| 2006/0068555 A1 | 3/2006 | Zhu et al. | |
| 2006/0068586 A1 | 3/2006 | Pain | |
| 2006/0071278 A1 | 4/2006 | Takao | |
| 2006/0091551 A1 | 5/2006 | Lin et al. | 257/762 |
| 2006/0154428 A1 | 7/2006 | Dokumaci | |
| 2006/0197158 A1 | 9/2006 | Babcock et al. | |
| 2006/0203581 A1 | 9/2006 | Joshi et al. | |
| 2006/0220114 A1 | 10/2006 | Miyashita et al. | |
| 2006/0223248 A1 | 10/2006 | Venugopal et al. | |
| 2007/0040222 A1 | 2/2007 | Van Camp et al. | |
| 2007/0117326 A1 | 5/2007 | Tan et al. | |
| 2007/0158790 A1 | 7/2007 | Rao | |
| 2007/0212861 A1 | 9/2007 | Chidambarrao et al. | |
| 2007/0238253 A1 | 10/2007 | Tucker | |
| 2008/0067589 A1 | 3/2008 | Ito et al. | |
| 2008/0079051 A1 | 4/2008 | Yuan et al. | |
| 2008/0108208 A1 | 5/2008 | Arevalo et al. | |
| 2008/0169493 A1 | 7/2008 | Lee et al. | |
| 2008/0169516 A1 | 7/2008 | Chung | |
| 2008/0197439 A1 | 8/2008 | Goerlach et al. | |
| 2008/0227250 A1 | 9/2008 | Ranade et al. | |
| 2008/0237661 A1 | 10/2008 | Ranade et al. | |
| 2008/0258198 A1 | 10/2008 | Bojarczuk et al. | |
| 2008/0272409 A1 | 11/2008 | Sonkusale et al. | |
| 2009/0057746 A1 | 3/2009 | Sugll et al. | |
| 2009/0108350 A1 | 4/2009 | Cai et al. | |
| 2009/0134468 A1 | 5/2009 | Tsuchiya et al. | |
| 2009/0219086 A1* | 9/2009 | Iida et al. | 330/4.9 |
| 2009/0224319 A1 | 9/2009 | Kohli | |
| 2009/0302388 A1 | 12/2009 | Cai et al. | |
| 2009/0309140 A1 | 12/2009 | Khamankar et al. | |
| 2009/0311837 A1 | 12/2009 | Kapoor | |
| 2009/0321849 A1 | 12/2009 | Miyamura et al. | |
| 2010/0012988 A1 | 1/2010 | Yang et al. | |

(56) References Cited

U.S. PATENT DOCUMENTS

| | | |
|---|---|---|
| 2010/0019351 A1 | 1/2010 | Ratnakumar et al. |
| 2010/0038724 A1 | 2/2010 | Anderson et al. |
| 2010/0100856 A1 | 4/2010 | Mittal |
| 2010/0148153 A1* | 6/2010 | Hudait et al. ............. 257/24 |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0273239 A1* | 11/2011 | Lee .................. 331/117 FE |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| WO | 2011062788 A1 | 5/2011 |

OTHER PUBLICATIONS

Cheng et al., "Extremely Thin SOI (ETSOI) CMOS with Record Low Variability for Low Power System-on-Chip Applications", IEDM 2009, Dec. 2009.

Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.

Drennan et al., "Implications of Proximity Effects for Analog Design", Custom Integrated Circuits Conference, 2006, CICC '06, IEEE, Sep. 10-13, 2006, pp. 169-176.

Hook et al., "Lateral Ion Implant Straggle and Mask Proximity Effect", IEEE Transactions on Electron Devices, vol. 50, No. 9, Sep. 2003.

Hori et al., "A 0.1 um CMOS with a Step Channel Profile Formed by Ultra High Vacuum CVD and In-Situ Doped Ions", IEDM 1993, May 12, 1993.

Matsuhashi et al., "High-Performance Double-Layer Epitaxial-Channel PMOSFET Compatible with a Single Gate CMOSFET", 1996 Symposium on VLSI Technology Digest of Technical Papers, 1996.

Shao et al., "Boron diffusion in silicon: the anomalies and control by point defect engineering", Materials Science and Engineering R 42 (2003), Nov. 2003, pp. 65-114.

Sheu et al., "Modeling the Well-Edge Proximity Effect in Highly Scaled MOSFETs", IEEE Transactions on Electron Devices, vol. 53, No. 11, Nov. 2006, pp. 2792-2798.

Komagiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., Integrating Intrinsic Parameter Fluctuation Description into BSIMSOI to Forecast sub-15 nm UTB SOI based 6T SRAM Operation, Solid-State Electronics (50), pp. 86-93.

Wong, H et al., "Nanoscale CMOS", Proceedings of the IEEE, Vo. 87, No. 4, pp. 537-570.

Machine Translation of KR 10-0794094 Submitted herewith.

Abdulai, M. et al., "A 0.5 V Fully Differential Gate-Input Operational Transconductance Amplifier with Intrinsic Common-Mode Rejection", International Symposium on Circuits and Systems Conference, 2006, pp. 2837-2840.

Allen, P. et al., " A 1V CMOS Opamp using Bulk-Driven MOSFETs", ISSCC Dig. Tech. Papers, 1995, pp. 192, 193.

Andreani, P. et al. "On the Use of MOS Varactors in RF VCO's" IEEE Journal of Solid-State Circuits, Jun. 2000, vol. 35, No. 6, pp. 905-910.

Assaderaghi, F. et al. "A Dynamic Threshold Voltage MOSFET (DTMOS) for Ultra-Low Voltage Operation", IEDM Tech. Dig., Apr. 1994, pp. 809-812.

Bunch, R. et al. "Large-Signal Analysis of MOS Varactors in CMOS-Gm LCVCOs", IEEE J. of Solid-State Circuits, Aug. 2003, vol. 38, No. 8, pp. 1325-1332.

Fried, R. et al. "Nano-Amp, Active-Bulk, Weak-Inversion Analog Circuits" Custom Integrated Circuits Conference, 1998, pp. 31-34.

Jenkins, K. et al. "Characteristics of Submicron MOS Varactors", Jan. 2006, IEEE SiRF.

Morshed, T. et al., BSIM4.6.4 MOSFET Model User Manual, 2009, University of California, Berkeley.

Sameni, P. et al. "Characterization and Modeling of Accumulation-Mode MOS Varactors", CCECE/CCGEI, May 2005, Saskatoon, pp. 1554-1557.

Tsividis, Y. et al., "Operation and Modeling of the MOS Transistor", Chapter 2, 2011, 3rd ed., New York: Oxford University Press, Inc.

Vittoz, Eric A., "Weak Inversion for Ultra Low-Power and Very Low-Voltage Circuits", IEEE Asian Solid-State Circuits Conference, Nov. 2009, Taipei, Taiwan, pp. 129-132.

Fujita, K. et al. "Advanced Channel Engineering Achieving Aggressive Reduction of Vt Variation for Ultra-Low-Power Applications", IEDM Tech. Dig., Dec. 2011, pp. 749-752.

English Abstract of JP2004087671 submitted herewith.
English Abstract of JP4186774 submitted herewith.
English Abstract of JP59193066 submitted herewith.
English Abstract of JP8153873 submitted herewith.
English Abstract of JP8288508 submitted herewith.
English Translation of JP8288508 submitted herewith.

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, 1995, pp. 23-24.

Chau, R et al., "A 50nm Depleted-Substrate CMOS Transistor (DST)", Electron Device Meeting 2001, IEDM Technical Digest, IEEE International, 2001, pp. 29.1.1-29.1.4.

Ducroquet, F et al. "Fully Depleted Silicon-On-Insulator nMOSFETs with Tensile Strained High Carbon Content Si1-yCy Channel", 2006, ECS 210th Meeting, Abstract 1033.

Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.

Goesele, U et al., Diffusion Engineering by Carbon in Silicon, 2000, Mat. Res. Soc. Symp. vol. 610.

(56) References Cited

OTHER PUBLICATIONS

Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.

Holland, OW and Thomas, DK "A Method to Improve Activation of Implanted Dopants in SiC", 2001, Oak Ridge National Laboratory, Oak Ridge, TN.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.

Lavéant, P. "Incorporation, Diffusion and Agglomeration of Carbon in Silicon", 2002, Solid State Phenomena, vols. 82-84, pp. 189-194.

Noda, K et al., "A 0.1-μm Delta-Doped MOSFET Fabricated with Post-Low-Energy Implanting Selective Epitaxy", Apr. 1998, IEEE Transactions on Electron Devices, vol. 45, No. 4, pp. 809-814.

Ohguro, T et al., "An 0.18-μm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378-1383.

Pinacho, R et al., "Carbon in Silicon: Modeling of Diffusion and Clustering Mechanisms", Aug. 2002, Journal of Applied Physics, vol. 92, No. 3, pp. 1582-1588.

Robertson, LS et al., "The Effect of Impurities on Diffusion and Activation of Ion Implanted Boron in Silicon", 2000, Mat. Res. Soc. Symp. vol. 610.

Scholz, R et al., "Carbon-Induced Undersaturation of Silicon Self-Interstitials", Jan. 1998, Appl. Phys. Lett. 72(2), pp. 200-202.

Scholz, RF et al., "The Contribution of Vacancies to Carbon Out-Diffusion in Silicon", Jan. 1999, Appl. Phys. Lett., vol. 74, No. 3, pp. 392-394.

Stolk, PA et al., "Physical Mechanisms of Transient Enhanced Dopant Diffusion in Ion-Implanted Silicon", May 1997, J. Appl. Phys. 81(9), pp. 6031-6050.

Thompson, S et al., "MOS Scaling: Transistor Challenges for the 21st Century", 1998, Intel Technology Journal Q3' 1998, pp. 1-19.

Wann, C. et al., "Channel Profile Optimization and Device Design for Low-Power High-Performance Dynamic-Threshold MOSFET", 1996, IEDM 96, pp. 113-116.

Werner, P et al., "Carbon Diffusion in Silicon", Oct. 1998, Applied Physics Letters, vol. 73, No. 17, pp. 2465-2467.

Yan, Ran-Hong et al., "Scaling the Si MOSFET: From Bulk to SOI to Bulk", Jul. 1992, IEEE Transactions on Electron Devices, vol. 39, No. 7.

U.S. Final Office Action issued in U.S. Appl. No. 14/301,512; 50 pages, May 5, 2015.

* cited by examiner

| VDD=0.5 V | DDC Transistors w/ gate and screen connected | Conventional transistors | % Difference |
|---|---|---|---|
| Gain (linear) | 5.75E+01 | 4.24E+01 | 35.61 |
| Phase Margin (degrees) | 9.94E+01 | 9.88E+01 | 0.65 |
| Unit Gain Frequency (Hz) | 4.68E+5 | 4.66E+05 | 0.43 |
| Power (W) | 3.11E-07 | 3.25E-07 | -4.31 |

| 5-stage Inverter Ring Oscillator | Gate-only | Gate and Screen | Gate and Screen | Gate-only |
|---|---|---|---|---|
| VDD (V) | 0.300 | 0.300 | 0.253 | 0.358 |
| Freq (MHz) | 1.360 | 5.220 | 1.360 | 5.240 |
| rms Power (nW) | 1.860 | 12.840 | 2.653 | 9.308 |

FIG. 11

ANALOG CIRCUITS HAVING IMPROVED INSULATED GATE TRANSISTORS, AND METHODS THEREFOR

CROSS-REFERENCE TO RELATED APPLICATIONS

This application claims the benefit of U.S. Provisional Applications Ser. No. 61/545,006, filed on Oct. 7, 2011 and Ser. No. 61/545,014, also filed on Oct. 7, 2011, the contents of which are incorporated by reference herein, in their entirety.

TECHNICAL FIELD

The present invention relates generally to analog circuits, and more particularly to analog circuits formed with insulated gate field effect transistors having a body bias connections.

BRIEF DESCRIPTION OF THE DRAWINGS

FIG. 11 is a table showing performance characteristics of a ring oscillators like those of FIGS. 10A to 10O.

DETAILED DESCRIPTION

Various embodiments of the present invention will now be described in detail with reference to a number of drawings. The embodiments show analog circuits having transistors with structures that provide for greater gain than conventional approaches. In particular embodiments, transistors can have a highly doped "screening" region formed below a channel that can be biased via a body terminal. Embodiments as described herein can be applicable to integrated circuits that include analog circuits, or mixes of analog and digital circuits.

Figure 1:
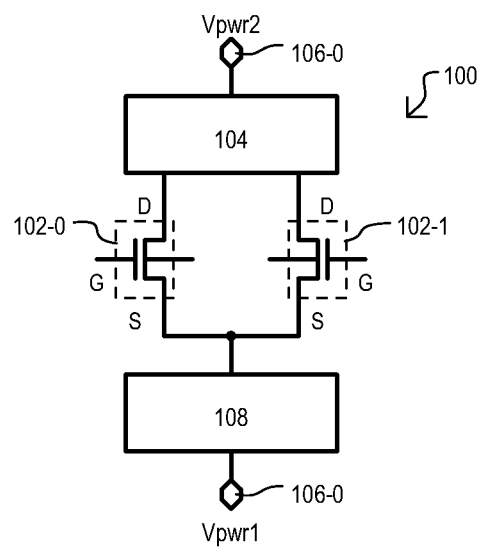
FIG. 1 is a block schematic diagram of a circuit according to an embodiment.

FIG. 1 shows a block schematic diagram of a circuit 100 according to one embodiment. A circuit 100 can include a pair of deeply depleted channel (DDC) transistors 102-0/1, a bias circuit 104, and a current path 108. DDC transistors 102-0/1 can each have a gate (G), source (S), drain (D) and body (B) terminal. Drains (D) can be connected to bias circuit 104, sources (S) can be commonly connected to current path 108. DDC transistors are insulated gate field effect transistors (referred to herein as "MOS" transistors) having a highly doped screening region (described below) that can be biased to provide for greater gain than conventional MOS transistors.

A bias circuit 104 can provide current to the drains (D) of DDC transistors 102-0/1, and can be connected to a first power supply terminal 106-0. A current path 108 can provide a current path between sources (S) of DDC transistors 102-0/1 and a second power supply terminal 106-1.

DDC transistors 102-0/1 can provide higher gain than conventional transistors, if the input signal is applied to both the gate and the screening region. While FIG. 1 shows n-channel transistors, such transistors can be p-channel transistors in other embodiments.

Figure 2A:
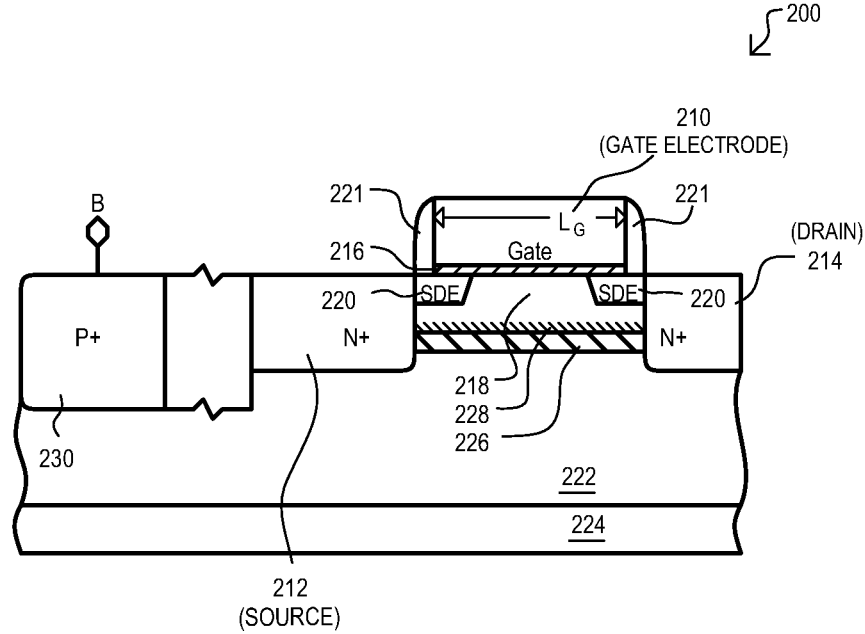
FIG. 2A is a side cross sectional view of a deeply depleted channel (DDC) transistor that can be included in embodiments.

FIG. 2A shows an embodiment of a deeply depleted channel (DDC) transistor 200 having an enhanced body coefficient, along with the ability to set threshold voltage Vt with enhanced precision, according to certain described embodiments. The DDC transistor 200 includes a gate electrode 210, source 212, drain 214, and a gate dielectric 216 positioned over a substantially undoped channel 218. Lightly doped source and drain extensions (SDE) 220, positioned respectively adjacent to source 212 and drain 214, extend toward each other, setting the transistor channel length ($L_G$). In the embodiment shown, insulating spacers 221 can be formed on sides of gate electrode 210.

In FIG. 2A, the DDC transistor 200 is shown as an N-channel transistor having a source 212 and drain 214 made of N-type dopant material, formed upon a substrate such as a P-type doped silicon substrate providing a P-well 222 formed on a substrate 224. In addition, the N-channel DDC transistor in FIG. 2 includes a highly doped screening region 226 made of P-type dopant material, and a threshold voltage set region 228 made of P-type dopant material. Screening region 226 can be biased via a body tap 230. It will be understood that, with appropriate changes to dopant materials, a P-channel DDC transistor can be formed.

Figure 2B:
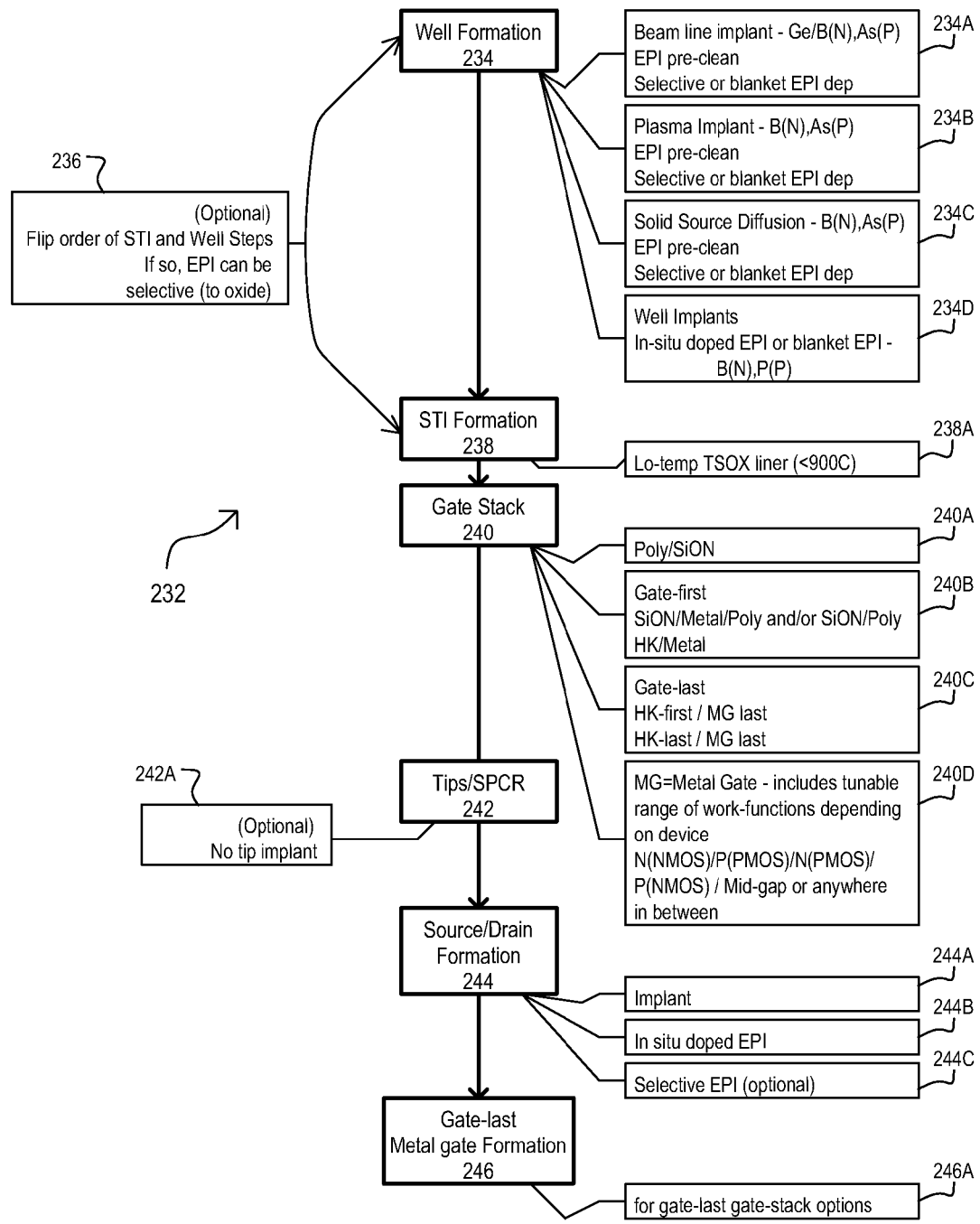
FIG. 2B is a flow diagram showing methods of fabricating a DDC transistor like that of FIG. 2A.

FIG. 2B is a flow diagram 232 illustrating a general method for forming a DDC transistor having an enhanced body coefficient and reduced σVt, in accordance with the various embodiments described herein. The process illustrated in FIG. 1B is intended to be general and broad in its description, and more detailed embodiments and examples are set forth below. Each block in the flow diagram is illustrated and described in further detail below, in conjunction with the various alternatives associated with each block illustrated in FIG. 2B.

In step 234, the process begins at well formation, which can include one or more different process steps in accordance with different embodiments. The well formation step 234 includes the steps for forming the screening region 226, the threshold voltage set region 228 (if present), and the substantially undoped channel 218. As indicated by 236, the well formation 234 can be before or after STI (shallow trench isolation) formation 238.

The well formation 234 can include forming the screening region 226 by implanting dopants into the P-well 222, followed by an epitaxial (EPI) pre-clean process that is followed by a blanket or selective EPI deposition. Various alternatives for performing these steps are illustrated in FIG. 2B. In accordance with one embodiment, well formation 234 can include a beam line implant of Ge/B (N), As (P), followed by an epitaxial (EPI) pre-clean process, and followed by a non-selective blanket EPI deposition, as shown in 234A.

Alternatively, the well formation 234 can include using a plasma implant of B (N), As (P), followed by an EPI pre-clean, then a non-selective (blanket) EPI deposition, as shown in 234B. The well formation 234 can alternatively include a solid-source diffusion of B(N), As(P), followed by an EPI pre-clean, and followed by a non-selective (blanket) EPI deposition, as shown in 234C. As yet another alternative, well formation 234 can also include well implants, followed by in-situ doped selective EPI of B (N), P (P) as shown in 234D. As will be described further below, the well formation can be configured with different types of devices in mind, including DDC transistors, legacy transistors, high $V_T$ transistors, low $V_T$ transistors, improved $\sigma V_T$ transistors, and standard or legacy $\sigma V_T$ transistors. Embodiments described herein allow for any one of a number of devices configured on a common substrate with different well structures and according to different parameters.

In step 234, Boron (B), Indium (I), or other P-type materials can be used for P-type implants, and arsenic (As), antimony (Sb) or phosphorous (P) and other N-type materials can be used for N-type implants. In certain embodiments, the screening region 226 can have a dopant concentration between about $5\times10^{18}$ to $1\times10^{20}$ dopant atoms/cm$^3$, with the selected dopant concentration dependent on the desired threshold voltage as well as other desired transistor characteristics. A germanium (Ge), carbon (C), or other dopant migration resistant layer can be incorporated above the screening region to reduce upward migration of dopants. The dopant migration resistant layer can be formed by way of ion implantation, in-situ doped epitaxial growth or other process. In certain embodiments, a dopant migration resistant layer can also be incorporated to reduce downward migration of dopants.

In certain embodiments of the DDC transistor, a threshold voltage set region 228 is positioned above the screening region 226. The threshold voltage set region 228 can be either adjacent to, incorporated within or vertically offset from the screening region. In certain embodiments, the threshold voltage set region 228 is formed by delta doping, controlled in-situ deposition, or atomic layer deposition. In alternative embodiments, the threshold voltage set region 226 can be formed by way of controlled outdiffusion of dopant material from the screening region 226 into an undoped epitaxial layer, or by way of a separate implantation into the substrate following formation of the screening region 226, before the undoped epitaxial layer is formed. Setting of the threshold voltage for the transistor is implemented by suitably selecting dopant concentration and thickness of the threshold voltage set region 228, as well as maintaining a separation of the threshold voltage set region 228 from the gate dielectric 216, leaving a substantially undoped channel layer directly adjacent to the gate dielectric 216. In certain embodiments, the threshold voltage set region 228 can have a dopant concentration between about $1\times10^{18}$ dopant atoms/cm$^3$ and about $1\times10^{19}$ dopant atoms per cm$^3$. In alternative embodiments, the threshold voltage set region 228 can have a dopant concentration that is approximately less than half of the concentration of dopants in the screening region 226.

In certain embodiments, an over-layer of the channel is formed above the screening region 226 and threshold voltage set region 228 by way of a blanket or selective EPI deposition (as shown in the alternatives shown in 234A-D), to result in a substantially undoped channel region 218 of a thickness tailored to the technical specifications of the device. As a general matter, the thickness of the substantially undoped channel region 218 ranges from approximately 5-25 nm, with the selected thickness based upon the desired threshold voltage for the transistor. Preferably, a blanket EPI deposition step is performed after forming the screening region 226, and the threshold voltage setting region 228 is formed by controlled outdiffusion of dopants from the screening region 226 into a portion of the blanket EPI layer, as described below. Dopant migration resistant layers of C, Ge, or the like can be utilized as needed to prevent dopant migration from the threshold voltage set region 228 into the substantially undoped channel region 218, or alternatively from the screening region 226 into the threshold voltage set region 228.

In addition to using dopant migration resistant layers, other techniques can be used to reduce upward migration of dopants from the screening region 226 and the threshold voltage set region 228, including but not limited to low temperature processing, selection or substitution of low migration dopants such as antimony or indium, low temperature or flash annealing to reduce interstitial dopant migration, or any other technique to reduce movement of dopant atoms can be used.

As described above, the substantially undoped channel region 218 is positioned above the threshold voltage set region 228. Preferably, the substantially undoped channel region 218 has a dopant concentration less than $5\times10^{17}$ dopant atoms per cm$^3$ adjacent or near the gate dielectric 216. In some embodiments, the substantially undoped channel region 218 can have a dopant concentration that is specified to be approximately less than one tenth of the dopant concentration in the screening region 226. In still other embodiments, depending on the transistor characteristics desired, the substantially undoped channel region 218 may contain dopants so that the dopant concentration is elevated to above $5\times10^{17}$ dopant atoms per cm$^3$ adjacent or near the gate dielectric 216 or by using a very light dose of halo implants. Preferably, the substantially undoped channel region 218 remains substantially undoped by avoiding the use of high dosage halo or other channel implants.

Referring still to FIG. 2B, STI formation 238, which, again, can occur before or after well formation 234, can include a low temperature trench sacrificial oxide (TSOX) liner, which is formed at a temperature lower than 900° C. as shown by 238A. Embodiments that form the STI structures after the blanket EPI deposition step, using a process that remains within a low thermal budget, can reduce dopant migration from the previously formed screening region 226 and threshold voltage setting region 228.

As shown in step 240 (FIG. 2B), a gate stack can be formed or otherwise constructed above the substantially undoped channel region 218 in a number of different ways, from different materials, and of different work functions. One option is a polysilicon(Poly)/SiON gate stack 240A. Another option is a gate-first process 240B that includes SiON/Metal/Poly and/or SiON/Poly, followed by High-K/Metal Gate. Another option, a gate-last process 240C includes a high-K/metal gate stack wherein the gate stack can either be formed with "Hi-K first-Metal gate last" flow or and "Hi-K last-Metal gate last" flow. Yet another option, 240D is a metal gate that includes a tunable range of work functions depending on the device construction. Preferably, the metal gate materials for n-channel MOS (NMOS) and p-channel MOS (PMOS) are selected to near mid-gap, to take full advantage of the DDC transistor. However, traditional metal gate work function band-gap settings may also be used. In one scheme, metal gate materials can be switched between NMOS and PMOS pairs as a way to attain the desired work functions for given devices.

A gate stack may be formed or otherwise constructed above the substantially undoped channel region 218 in a number of different ways, from different materials including polysilicon and metals to form what is known as "high-k metal gate". The metal gate process flow may be "gate $1^{st}$" or "gate last". Preferably, the metal gate materials for NMOS and PMOS are selected to near mid-gap, to take full advantage of the DDC transistor. However, traditional metal gate work function band-gap settings may also be used. In one scheme, metal gate materials can be switched between NMOS and PMOS pairs as a way to attain the desired work functions for given devices. Following formation of the gate stack, source/drain portions may be formed. Typically, the extension portions are implanted, followed by additional spacer formation and then implant or, alternatively, selective epitaxial deposition of deep source/drain regions.

In step 242, Source/Drain tips can be implanted. The dimensions of the tips can be varied as required, and will depend in part on whether gate spacers (SPGR) are used. In one embodiment, Source/Drain tips are not formed (step 242A), and there may be no tip implant.

In step 244, the source 212 and drain 214 can be formed preferably using conventional processes and materials such as ion implantation (244A) and in-situ doped epitaxial deposition (244B). Optionally, as shown in step 244C, PMOS or NMOS selective EPI layers can be formed in the source and drain regions as performance enhancers for strained channels. Source 212 and drain 214 can further include raised and/or recessed source/drains, asymmetrically doped, counter-doped or crystal structure modified source/drains, or implant doping of source/drain extension regions according to LDD (lightly doped drain) techniques, provided that the thermal budget for any anneal steps be within the boundaries of what is required to keep the screening region 226 and threshold voltage setting region 228 substantially intact.

In step 246, a metal gate is formed in accordance with a gate last process. Step 246 is optional and may be performed only for gate-last processes (246A).

Referring back to FIG. 2A, the channel 218 contacts and extends between the source 212 and the drain 214, and supports movement of mobile charge carriers between the source and the drain. In operation, when gate electrode voltage is applied to the DDC transistor 200 at a predetermined level, a depletion region formed in the substantially undoped channel 218 can extend to the screening region 226, since channel depletion depth is a function of the integrated charge from dopants in the doped channel lattice, and the substantially undoped channel 218 has very few dopants. The screening region 226, if fabricated according to specification, effectively pins the depletion region to define the depletion zone width.

As will also be appreciated, position, concentration, and thickness of the screening region 226 can be important factors in the design of the DDC transistor. In certain embodiments, the screening region 226 is located above the bottom of the source and drain junctions. A screening region 226 can be doped to cause a peak dopant concentration to define the edge of the depletion width when the transistor is turned on. Such a doping of a screening region 226 can include methods such as delta doping, broad dopant implants, or in-situ doping is preferred, since the screening region 226 should have a finite thickness to enable the screening region 226 to adequately screen the well below, while avoiding creating a path for excessive junction leakage. When transistors are configured to have such screening regions, the transistor can simultaneously have good threshold voltage matching, high output resistance, low junction leakage, good short channel effects, and still have an independently controllable body due to a strong body effect. In addition, multiple DDC transistors having different threshold voltages can be easily implemented by customizing the position, thickness, and dopant concentration of the threshold voltage set region 228 and/or the screening region 226 while at the same time achieving a reduction in the threshold voltage variation.

In one embodiment, the screening region is positioned such that the top surface of the screening region is located approximately at a distance of Lg/1.5 to Lg/5 below the gate (where Lg is the gate length). In one embodiment, the threshold voltage set region has a dopant concentration that is approximately 1/10 of the screening region dopant concentration. In certain embodiments, the threshold voltage set region is thin so that the combination of the threshold voltage set region and the screening region is located approximately within a distance of Lg/1.5 to Lg/5 below the gate.

Modifying threshold voltage by use of a threshold voltage set region 228 positioned above the screening region 226 and below the substantially undoped channel 218 is an alternative technique to conventional threshold voltage implants for adjusting threshold voltage. Care must be taken to prevent dopant migration into the substantially undoped channel 218, and use of low temperature anneals and anti-migration materials such as carbon or germanium can be included in embodiments. More information about the formation of the threshold voltage set region 228 and the DDC transistor is found in pending U.S. patent application Ser. No. 12/895,785 filed Sep. 30, 2010, the entirety of which disclosure is herein incorporated by reference.

Yet another technique for modifying threshold voltage relies on selection of a gate material having a suitable work function. The gate electrode 210 can be formed from conventional materials, preferably including, but not limited to, metals, metal alloys, metal nitrides and metal silicides, as well as laminates thereof and composites thereof. In certain embodiments the gate electrode 210 may also be formed from polysilicon, including, for example, highly doped polysilicon and polysilicon-germanium alloy. Metals or metal alloys may include those containing aluminum, titanium, tantalum, or nitrides thereof, including titanium containing compounds such as titanium nitride. Formation of the gate electrode 210 can include silicide methods, chemical vapor deposition methods and physical vapor deposition methods, such as, but not limited to, evaporative methods and sputtering methods. Typically, the gate electrode 210 has an overall thickness from about 1 to about 500 nanometers. In certain embodiments, metals having a work function intermediate between band edge and mid-gap can be selected. As discussed in pending U.S. patent application Ser. No. 12/960,266 filed Dec. 3, 2010, the entirety of which disclosure is herein incorporated by reference, such metal gates simplify swapping of PMOS and NMOS gate metals to allow a reduction in mask steps and different required metal types for systems on a chip or other die supporting multiple transistor types.

Applied bias to the screening region 226 is yet another technique for modifying threshold voltage of a DDC transistor 200. The screening region 226 sets the body effect for the transistor and allows for a higher body effect than is found in conventional FET technologies. For example, a body tap 230 to the screening region 226 of the DDC transistor can be formed in order to provide further control of threshold voltage. The applied bias can be either reverse or forward biased, and can result in significant changes to threshold voltage. Bias can be static or dynamic, and can be applied to isolated transistors, or to groups of transistors that share a common well. Biasing can be static to set threshold voltage at a fixed set point, or dynamic, to adjust to changes in transistor operating conditions or requirements. Various suitable biasing techniques are disclosed in pending U.S. patent application Ser. No. 12/708,497 filed Feb. 18, 2010, the entirety of which disclosure is herein incorporated by reference.

Advantageously, DDC transistors created in accordance with the foregoing embodiments, structures, and processes, can have a reduced mismatch arising from scattered or random dopant variations as compared to conventional MOS transistors. In certain embodiments, the reduced variation results from the adoption of structures such as the screening region, the optional threshold voltage set region, and the epitaxially grown channel region. In certain alternative embodiments, mismatch between DDC transistors can be reduced by implanting the screening layer across multiple DDC transistors before the creation of transistor isolation structures, and forming the channel layer as a blanket epitaxial layer that is grown before the creation of transistor epitaxial structures. In certain embodiments, the screening region has a substantially uniform concentration of dopants in a lateral plane. The DDC transistor can be formed using a semiconductor process having a thermal budget that allows for a reasonable throughput while managing the diffusivities of the dopants in the channel. Further examples of transistor structure and manufacture suitable for use in DDC transistors are disclosed in U.S. patent application Ser. No. 12/708,497 (previously mentioned above) as well as U.S. patent application Ser. No. 12/971,884, filed on Dec. 17, 2010 and U.S. patent application Ser. No. 12/971,955 filed on Dec. 17, 2010, the respective contents of which are incorporated by reference herein.

Figure 3:
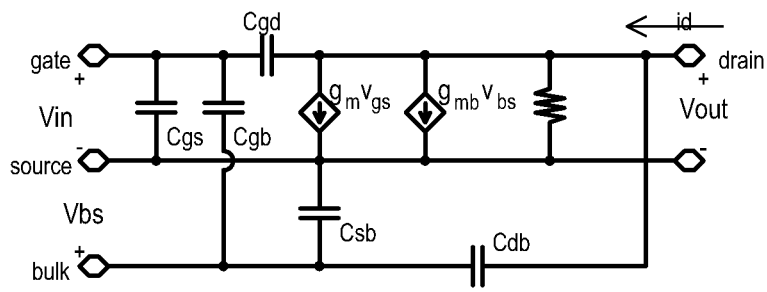
FIG. 3 is a diagram of a model of a DDC transistor, like that of FIG. 2A, which can be included in embodiments.

FIG. 3 shows a simplified small signal model of the DDC transistor, where the input signal Vin is applied to both the gate and the screening region of the DDC transistor, i.e., Vgs=Vbs=Vin. Under these conditions, the output voltage Vout is governed by the following equation:

$$Vout=(gm*Vgs+gmb*Vbs)*rout$$

Substituting Vgs=Vbs=Vin:

$$Vout=(gm*Vin+gmb*Vin)*rout=(gm+gmb)$$
$$*rout*Vin=(gmeff*rout)*Vin$$

Therefore, a DDC transistor can have greater gain when the input signal is applied to both the gate and the screening region of the DDC transistor, because the effective transconductance of the DDC transistor (gmeff) is greater than the transconductance (gm) when the input signal is only applied to the gate. In addition, in one embodiment, the DDC transistor has a transconductance (gm) and output impedance (rout) that are greater than that of a conventional MOSFET, and therefore, the gain of the DDC transistor is increased as compared to a conventional MOSFET, as a result of applying the input signal to both the gate and the screening region of the DDC transistor.

Figure 4:
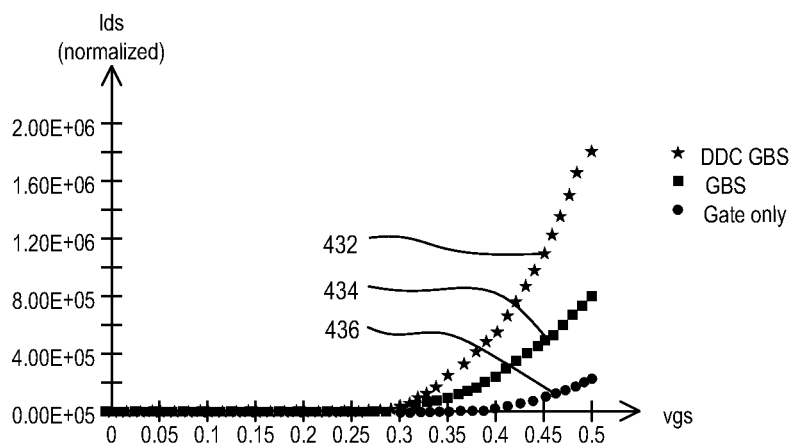
FIG. 4 is a graph showing the relationship between drain-source current and gate-source voltage for a DDC transistor and conventional transistor.

FIG. 4 is a graph showing the relationship 432 between normalized Ids (drain to source current) and Vgs (gate to source voltage) for a DDC transistor when the input signal is applied to both the screening region and the gate terminals, in accordance with one embodiment. FIG. 4 also shows the relationship 434 for a conventional transistor when the input signal is applied to both body and gate terminals, and the relationship 436 for conventional transistor when the input signal is applied only to the gate terminal. The graphs shown in FIG. 4 were obtained from simulations performed on a DDC transistor and conventional transistor having one micron width and a one micron length, when the drain to source voltage is 0.5 volts. FIG. 4 shows that the DDC transistor with the input signal applied to both the screening region and the gate terminals, has a higher gain in the sub-threshold mode, when compared to the conventional transistor.

Figure 5A:
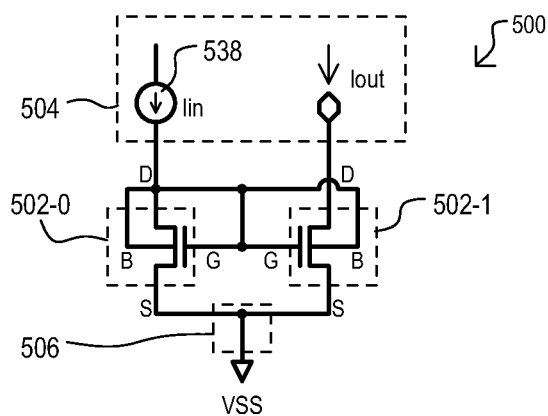
FIG. 5A is a block schematic diagram of a current mirror circuit with DDC transistors according to an embodiment.

FIG. 5A shows a schematic diagram of a current mirror 500 using DDC transistors, in accordance with one embodiment. Current mirror 500 can be one very particular implementation of the circuit shown in FIG. 1. A current mirror 500 can include two DDC transistors 502-0/1, bias circuit 504 and output current path 506. For DDC transistor 502-0, the gate (G), body (i.e., screening region) (B) and drain (D) terminals are connected together. For DDC transistor 502-1, the gate (G) and screening region (B) terminals are connected together. Sources (S) of DDC transistors 502-0/1 can be commonly connected to a low power supply voltage (VSS) via a current path 508.

A bias circuit 504 can include a current source 538 which can provide a reference current to Iin to a drain of DDC transistor 502-0. If the DDC transistor 502-1 and 502-0 have good matching of their electrical characteristics (such as channel length, width, threshold voltage, etc.), DDC transistor 502-1 can mirror DDC transistor 502-0 such that the output current Iout is about the same as Iin, or such devices can be scaled with respect to one another to provide an accurate multiplication of an input current.

Figure 5B:
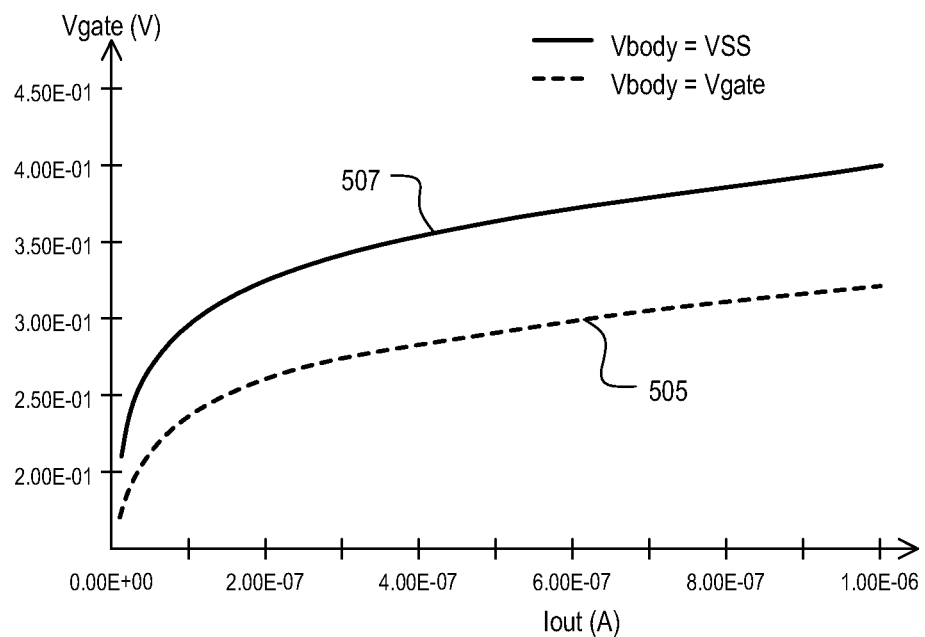
FIG. 5B is a graph showing the relationship between current mirror output current and gate voltage for the current mirror circuit of FIG. 5A and a conventional current mirror circuit.

FIG. 5B is a graph showing the relationship between the output current (labeled "Iout" in FIG. 5A) and the gate voltage (labeled "Vgate"), which is the voltage at the gate of transistor 502-0) of the current mirror 500, in accordance with one embodiment. The curve 505 shows the relationship between Iout and gate voltage for the current mirror embodiment shown in FIG. 5A, where the voltage signal at the gate terminal is also applied to the screening region terminal. The curve 507 shows the relationship between Iout and gate voltage for a current mirror embodiment that uses DDC transistors, but the screening region terminals of the DDC transistors 502-0/1 are connected to VSS instead of being connected to the gate, such that no voltage signal is applied to the screening region. FIG. 5B shows that the current mirror having the voltage signal applied to both the screening region and gate terminals can require a lower gate voltage to provide a predetermined current Iout compared to a current mirror with the voltage signal applied to the gate terminal only (i.e., with no voltage signal applied to the screening region terminal). For example, for the embodiments illustrated in FIG. 5, the gate voltage can be approximately 80 mV lower for the same current Iout, when the voltage signal is applied to both the screening region and gate terminals.

Figure 6A:
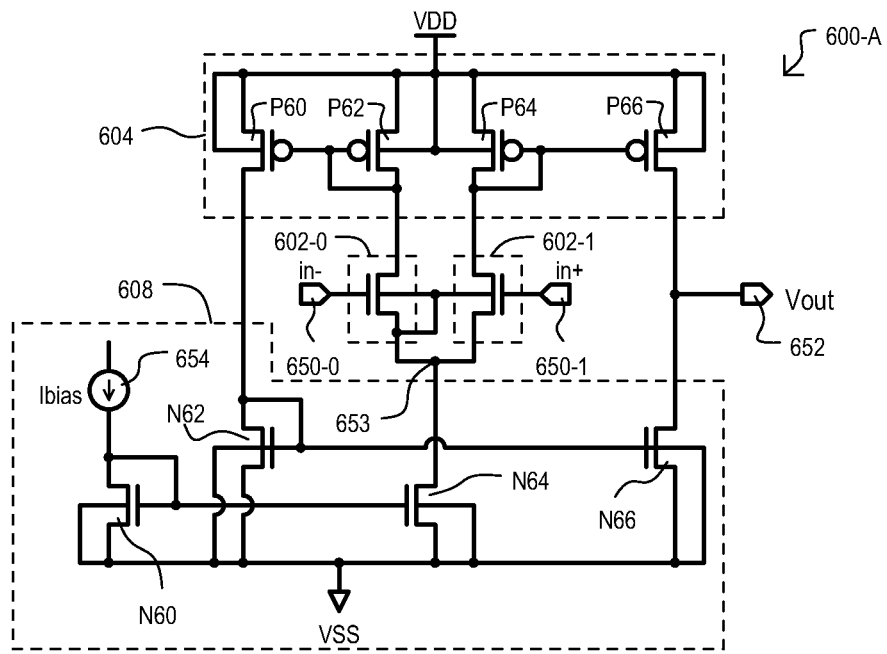
FIGS. 6A and 6B are block schematic diagrams of operational transconductance amplifier (OTA) circuits having DDC transistors according to embodiment.
Figure 6B:
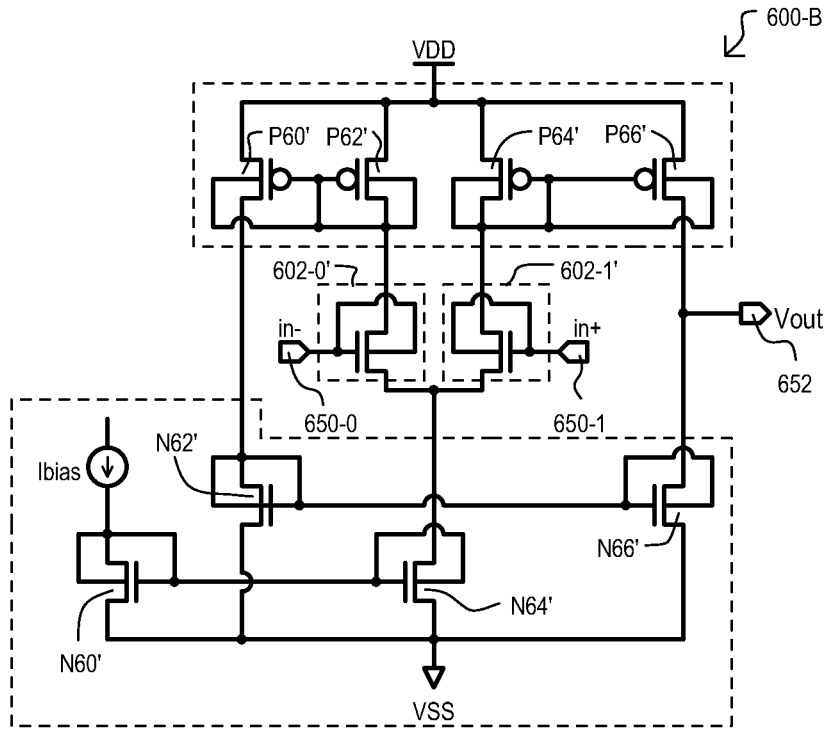

FIGS. 6A and 6B are schematic diagrams of operational transconductance amplifier (OTA) circuits 600-A/B incorporating DDC transistors, in accordance with certain embodiments. Such OTA circuits can be particular implementation of the circuit shown in FIG. 1.

Referring to FIG. 6A, an OTA circuit 600-A can include a pair of input DDC transistors 602-0/1, a bias circuit 604, and a current path bias circuit 608. A bias circuit 604 can include current mirror P60/P62 connected to the drain of DDC transistor 602-0, and a current mirror P64/P66 connected to a drain of transistor 602-1. Bodies of p-channel transistors P60/P62/P64/P66 can be connected to a high power supply voltage (VDD). Transistor P66 can serve as a pull-up portion of an output stage that drives output 652. In one embodiment, transistors P60/P62/P64/P66 can be DDC transistors and thus have screening regions connected to VDD.

DDC transistors 602-0/1 can form a differential pair. DDC transistor 602-0 can have a gate connected to a first input 650-0 and a drain connected to current mirror P60/P62. DDC transistor 602-1 can have a gate connected to a second input 650-1 and a drain connected to current mirror P64/P66. Sources and bodies (i.e., screening regions) of DDC transistors 602-0/1 can be commonly connected to a bias node 653.

Current path bias circuit 608 can include current mirror N60/N64, which can provide a bias current to differential pair 602-0/1 based on a reference current Ibias from a current source 654. Bias circuit 608 also includes current mirror N62/N66, which can serve as an active load to current mirrors P60/P6 and P64/P66, respectively. Transistor N66 can serve as an output load for the output 652. In one embodiment, transistors N60/N62/N64/N66 can be DDC transistors and thus have screening regions connected to VSS.

Referring to FIG. 6B, an OTA circuit 600-A can include a structure like that of FIG. 6A, however, screening regions of transistors can be connected to their corresponding gates. Accordingly, bodies (and hence screening regions) of input DDC transistors 602-0'/1' can be connected to their respective gates.

In one embodiment, transistors P60'/P62'/P64'/P66' can be DDC transistors and thus have screening regions connected to their corresponding gates. In addition or alternatively, transistors N60'/N62'/N64'/N66' can have their screening regions connected to their gates.

In the embodiments of FIGS. 6A and 6B, a reference current Ibias can be selected to ensure that all DDC transistors operate in the sub-threshold mode. In such an embodiment, transistors can provide greater current gain at lower gate voltages, thus a power supply voltage can be lower than op amps constructed of conventional transistors. In some embodiments a power supply voltage (i.e., VDD-VSS) can be 0.5 volts. In alternative embodiments, a power supply voltage can be less than 0.5 volts.

Figure 7A:
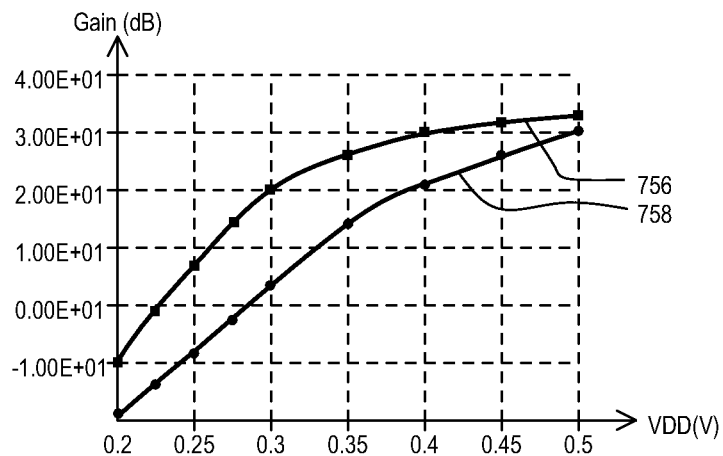
FIGS. 7A to 7D are graphs showing OTA performance characteristics for OTAs like those of FIGS. 6A and 6B.
Figure 7B:
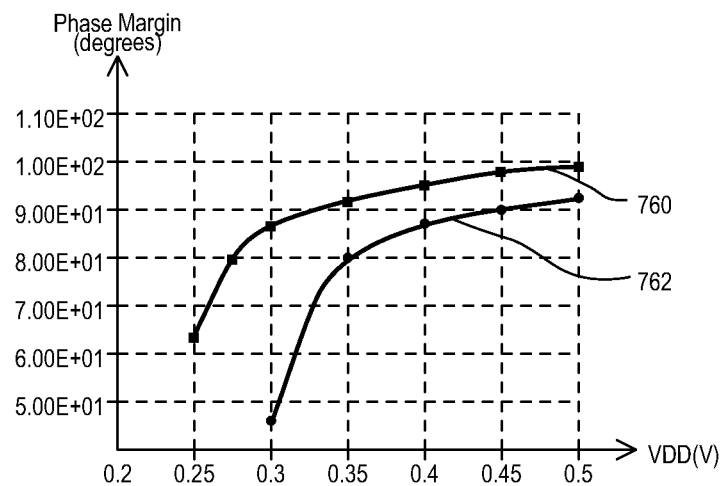
Figure 7C:
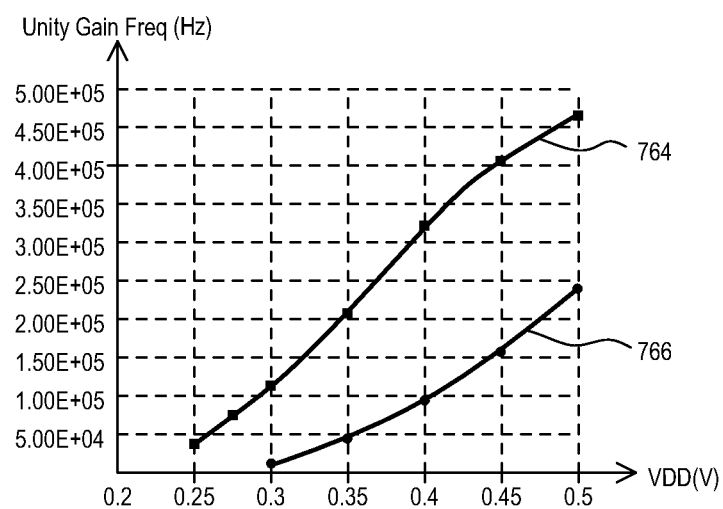
Figures 7D, 8:
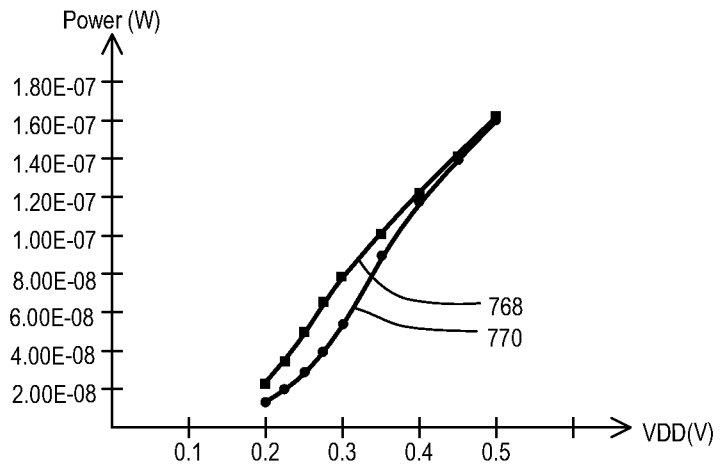
FIG. 8 is a table showing performance characteristics for an OTA like that of FIG. 6B and a conventional OTA.

FIGS. 7A to 7D are graphs showing operating characteristics of the OTA circuits of FIGS. 6A and 6B at various power supply voltages (VDD). FIG. 7A compares the gain 758 of an OTA circuit like that of FIG. 6A with DDC transistors (hereinafter referred to "gate only") and the gain 756 of an OTA circuit like that of FIG. 6B with DDC transistors (hereinafter referred to as "gate and screen"). FIG. 7B compares a phase margin of the gate only configuration 762 with that of a gate and screen configuration 760. FIG. 7C compares a unity gain frequency of a gate only configuration 766 with that of a gate and screen configuration 764. FIG. 7D compares power consumption of a gate only configuration 770 with that of a gate and screen configuration 768.

The graphs illustrated in FIGS. 7A to 7D were obtained from AC simulation of the OTA circuits of FIGS. 6A and 6B (with all DDC transistors) with a 1 pF capacitor load on the output terminal 652. The graphs in FIGS. 7A to 7D illustrate that the OTA circuit 600-B having the signal applied to both the gate and the screening region terminals has enhanced performance (as illustrated by curves 756, 760, 764, and 768) for the same power and can provide a higher gain and operate at a lower value of supply voltage VDD as compared to the gate only OTA circuit configuration (as illustrated by curves 758, 762, 766, and 770).

FIG. 8 is a table illustrating simulation results obtained from simulations performed on an OTA circuit using DDC transistors and having the gate and screening region terminals connected together (as in FIG. 6B), and an OTA circuit using conventional transistors, in accordance with one embodiment. The simulation results were obtained for a power supply voltage of 0.5 volts. The OTA circuit using DDC transistors has enhanced performance characteristics, at least in part, due to the enhanced output resistance and the enhance effective transconductance of the DDC transistor.

Figure 9:
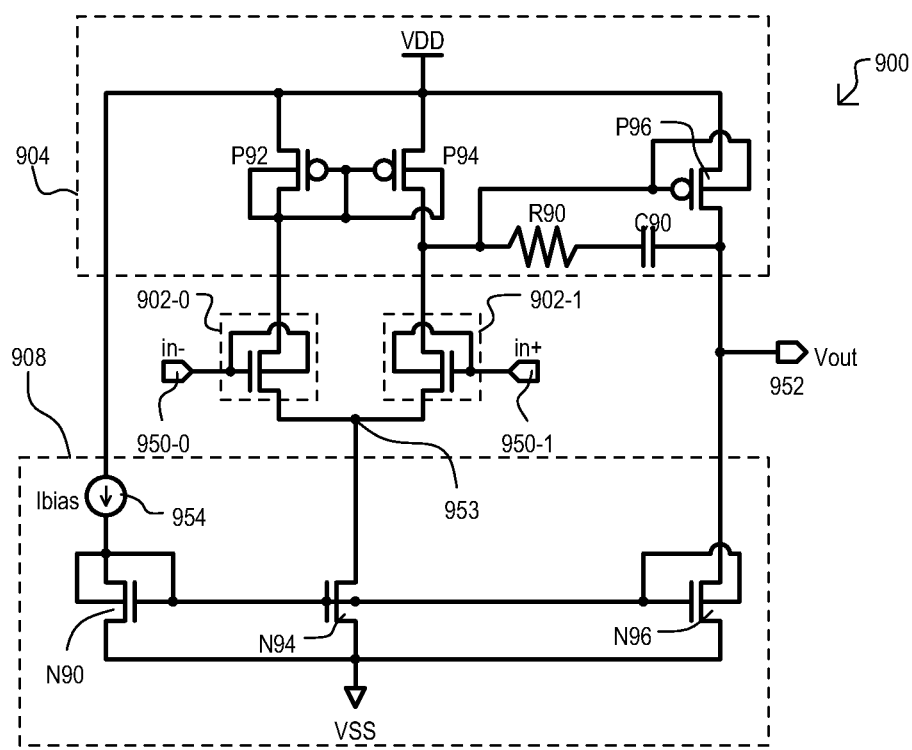
FIG. 9 is a block schematic diagram of an op amp with DDC transistors according to another embodiment.

FIG. 9 is a schematic diagram of an operational amplifier 900 using DDC transistors according to a further embodiment. An op amp circuit 900 can include a pair of input DDC transistors 902-0/1, a bias circuit 904, and a current path bias circuit 908. A bias circuit 904 can include current mirror formed by p-channel DDC transistors P92/P94 with drains connected to the drains of DDC transistors 902-0/1, resistor R90, capacitance C90 and an output p-channel DDC transistor P96. P-channel DDC transistors P92/P94/P96 can have bodies (i.e., screening regions) connected to their gates, and sources connected to power supply VDD.

DDC transistors 902-0/1 can form a differential pair, and have their gates connected to the bodies (i.e., screening regions), and sources connected to common node 953.

Current bias circuit 908 can include current mirror formed by n-channel DDC transistors N90/N94, a current source 954, and output n-channel DDC transistor N96. Current mirror circuit N90/N94 can provide a bias current to differential pair 902-0/1 based on a reference current Ibias from a current source 954. Bias circuit 908 also includes current mirror N62/N66, which can serve as an active load to current mirrors P60/P6 and P64/P66, respectively. Transistor N66 can serve as an output load for the output 952. Sources of DDC transistors N90/N94/N96 can be connected to a low power supply VSS.

Referring still to FIG. 9, an input signal can be connected to input terminals 950-0/1, and thus to the gate and screening region terminals of the 902-0/1. An amplified output voltage (Vout) can appear on output node 952.

In one embodiment, a power supply voltage (VDD) can be 0.5 volts and a lower power supply voltage (VSS) can be 0 volts. In alternative embodiments, a power supply voltage (VDD) can be less than 0.5 volts and a lower power supply voltage (VSS) can be 0 volts.

DDC transistors configured to receive an input signal at both the gate terminal and the screening region terminal can also be used in digital circuit configurations.

Such embodiments using DDC transistors can include inverters, NAND gates, and NOR gates. In one embodiment, one or more transistors in a digital circuit configuration can be a DDC transistor configured to receive an input signal at both a gate terminal and the screening region terminal. Such embodiments can be capable of sub-threshold operation. In one embodiment, such digital circuits can operate at power supply voltages less than 0.5 volts. In an alternative embodiment, such digital circuits can operate at a power supply voltage of approximately 0.3 volts. In one embodiment of such circuits having a digital configuration, the parasitic BJT current is very small and the digital circuit can have reduced likelihood of latch-up (greater latch-up resistance or avoidance) at low power supply voltages (as low as 0.3 volts) because the forward bias in the PN-junctions may not be sufficient to generate a significant current in these circuits.

Figure 10A:
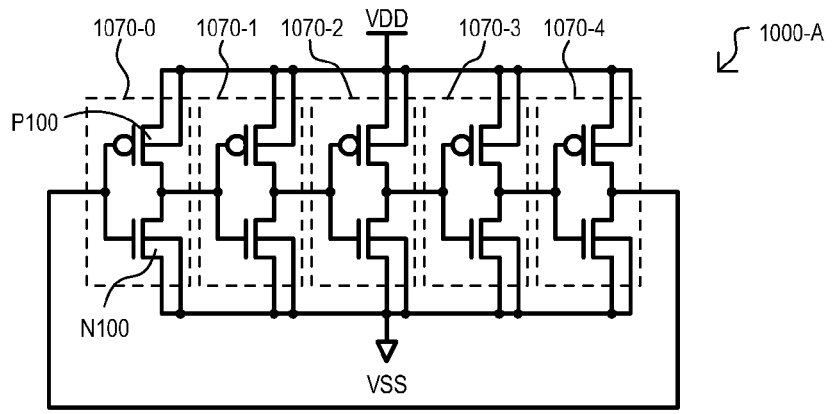
FIGS. 10A to 10O are schematic diagrams of ring oscillator circuits having DDC transistors according to embodiments.
Figure 10B:
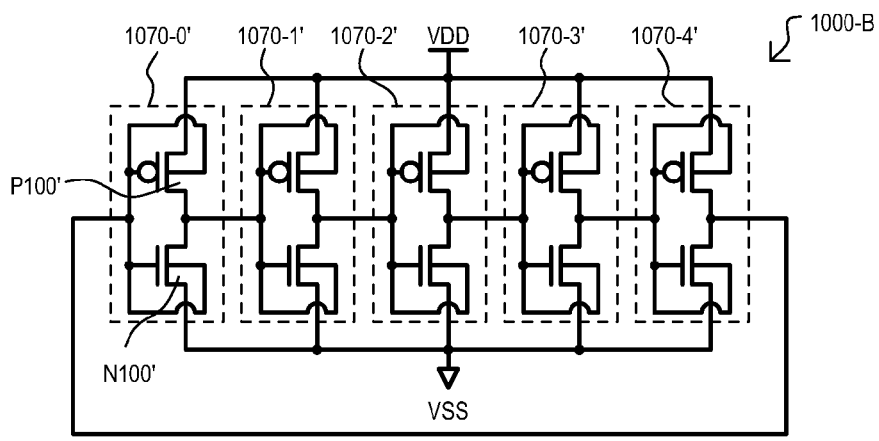

FIGS. 10A and 10B are schematic diagrams of five stage ring oscillators that are implemented with DDC transistors, in accordance with embodiments. FIG. 10A shows a ring oscillator 1000-A having five stages 1070-0 to -4, with each stage including a p-channel DDC transistor P100 and an n-channel DDC transistor connected in a CMOS inverter type configuration. P-channel DDC transistors P100 can have bodies (i.e., screening regions) connected to a high power supply voltage VDD, while n-channel DDC transistors N100 can have bodies (i.e., screening regions) connected to a low power supply voltage VSS.

FIG. 10B shows a ring oscillator 1000-B having five stages 1070-0' to -4' like that of FIG. 10A. However, in FIG. 10B, n-channel and p-channel DDC transistors P100'/N100' can have bodies (i.e., screening regions) connected to their respective gates.

Figure 10C:
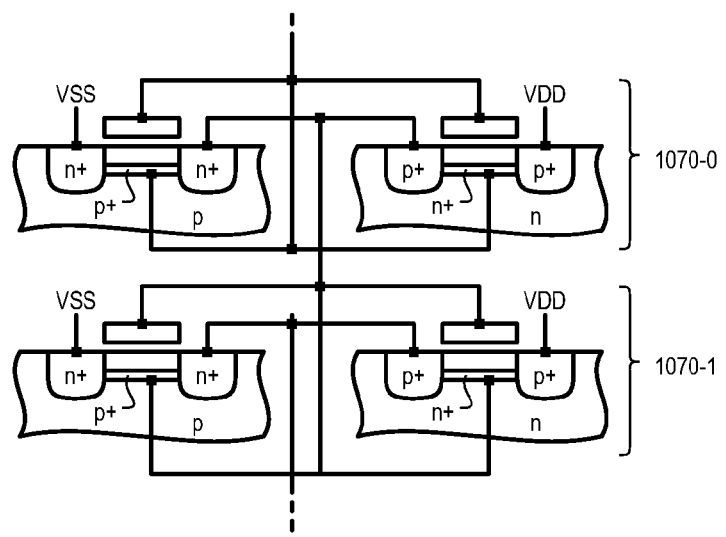

FIG. 10C is a diagram showing two oscillator stages 1070-0/1 in side cross sectional views. FIG. 10C shows how connecting gate and screening region to one another can produce an equivalent circuit to a gate-only circuit (e.g., the circuit of FIG. 10A) in parallel with a parasitic bipolar version of the circuit. Similar to the embodiments discussed above, connecting the gate and screening region terminals of the DDC transistors can increase the effective transconductance of the DDC transistor resulting in circuits in digital configurations that operate at a higher speed operation at a given power supply voltage than circuits with conventional transistors having conventional terminal connections.

FIG. 11 is a table summarizing the speed and power of the five stage ring oscillator illustrated in FIG. 10A (columns labeled "Gate-only") and FIG. 10B (columns labeled "Gate and Screen"). The speed for the ring oscillator of FIG. 10B can be up to 4 times faster than that of the ring oscillator of FIG. 10A, at VDD=0.3 V. In certain embodiments, the power supply voltage of the ring oscillator of FIG. 10B can be reduced to voltages as low as about 0.25 V to achieve the same speed as the ring oscillator of FIG. 10A operating at a higher power supply voltage.

While embodiments have shown circuits with DDC transistors as active circuit elements, other embodiments can employ such structures to realize passive circuit elements. In particular embodiments, DDC transistors can be used in variable capacitance (e.g., varactor) type circuits. Embodiments can include varactor circuits with DDC transistors having an enhanced body coefficient. Particular embodiments of the method and techniques described herein may be applicable to integrated circuits that include ring oscillators, and voltage controlled oscillators.

Figure 12:
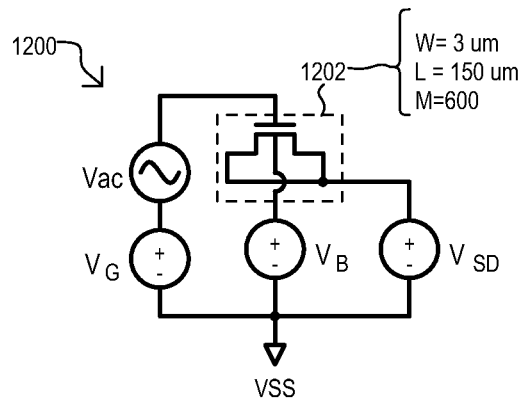
FIG. 12 is a block schematic diagram of a DDC transistor varactor and test circuit according to an embodiment.

FIG. 12 shows a DDC transistor 1202 configured as an inversion mode MOS-type (I-MOS) varactor (hereafter referred to as "DDC I-MOS varactor") configured to operate in a test circuit 1200, according to an embodiment. A DDC I-MOS varactor 1202 has an enhanced capacitance tuning range arising from the enhanced body coefficient and smaller threshold voltage variation of the DDC transistor.

Figure 13A:
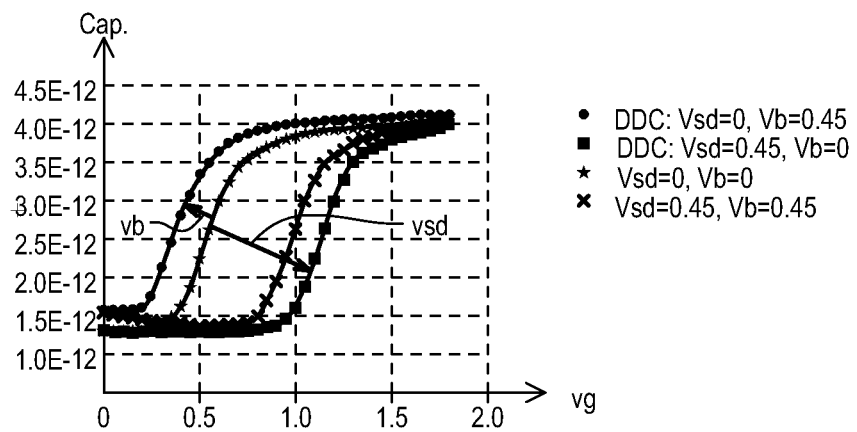
FIGS. 13A and 13B are graphs showing capacitance variations of a DDC based varactor according to an embodiment, and a conventional MOS varactor.
Figure 13B:
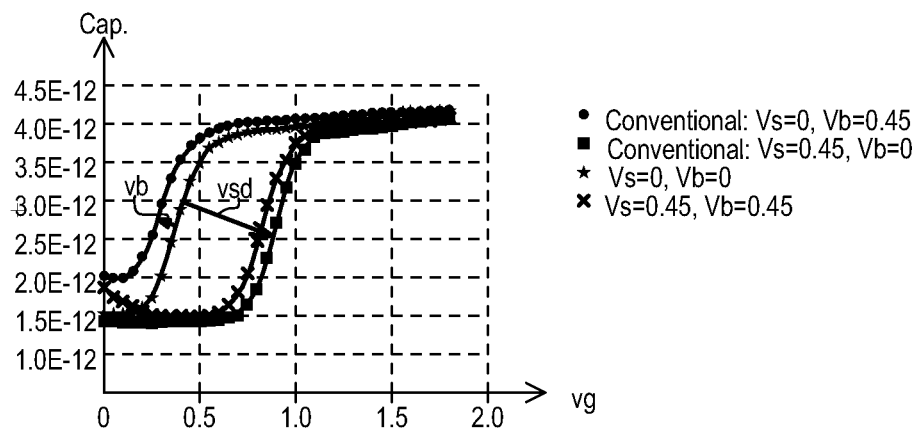

FIGS. 13A and 13B illustrate graphs of capacitance as a function of the gate voltage (hereinafter referred to as "C-V curves") showing the enhanced capacitance tuning range of the DDC I-MOS varactor 1202, in accordance with embodiments.

The C-V curves shown in FIG. 13A are small signal analysis results obtained from simulations performed with the test circuit 1200 using a DDC I-MOS varactor as described herein. Tests included sweeping the gate bias voltage, $V_G$, with four different bias combinations for $V_{SD}$ and $V_B$.

The C-V curves shown in FIG. 13B are simulation results corresponding to those of FIG. 13A, but with conventional MOS transistor based I-MOS varactor.

The four bias conditions used in FIGS. 13A and 13B are (i) $V_{SD}$=0 volts and $V_B$=0.45 volts, (ii) $V_{SD}$=0.45 volts and $V_B$=0 volts, (iii) $V_{SD}$=0 volts and $V_B$=0 volts, and (iv) $V_{SD}$=0.45 volts and $V_B$=0.45 volts. The frequency of the test signal $V_{ac}$ was 500 MHz for the simulation results shown in FIGS. 13A and 13B. In one embodiment, the bias voltage $V_B$ is applied to the screening region of the DDC transistor used to implement the DDC I-MOS varactor 1202.

FIG. 13A illustrates that in addition to the voltage $V_{SD}$, the voltage $V_B$ can also be used to increase the capacitance tuning range of the DDC I-MOS varactor 1202. FIG. 13A includes arrow labeled "vb", which shows a capacitance shift corresponding to changes in a body voltage $V_B$ (i.e., screening region bias), and arrow labeled "vsd", which shows a capacitance shift corresponding to changes in a source-drain voltage ($V_{SD}$) As shown, a greater shift occurs with $V_{SD}$ than with $V_B$ for the same amount of voltage change (0.45 V). Further, the C-V curves shift in opposite directions for $V_{SD}$ and $V_B$ bias voltages. In one embodiment, the widest capacitance tuning range can be obtained by changing the bias voltages $V_{SD}$ and $V_B$ in opposite directions (i.e., in the very particular conditions of FIG. 13A, by changing the bias voltage $V_{SD}$ from 0V to 0.45V, while the bias voltage $V_B$ is changed from 0.45V to 0V). In one embodiment, the capacitance tuning range of the DDC I-MOS varactor 1202 can be enhanced by approximately 30%, as a result of applying the bias voltage $V_{SD}$ and $V_B$ as described.

FIG. 13B includes corresponding arrows labeled "vb" and "vsd" showing capacitance shifts for a conventional I-MOS varactor. As shown by comparing FIGS. 13A and 13B, the DDC I-MOS varactor has an enhanced capacitance tuning range as the bias voltages $V_{SD}$ and $V_B$ are changed as compared to the corresponding capacitance tuning range of conventional I-MOS varactor.

Figure 14A:
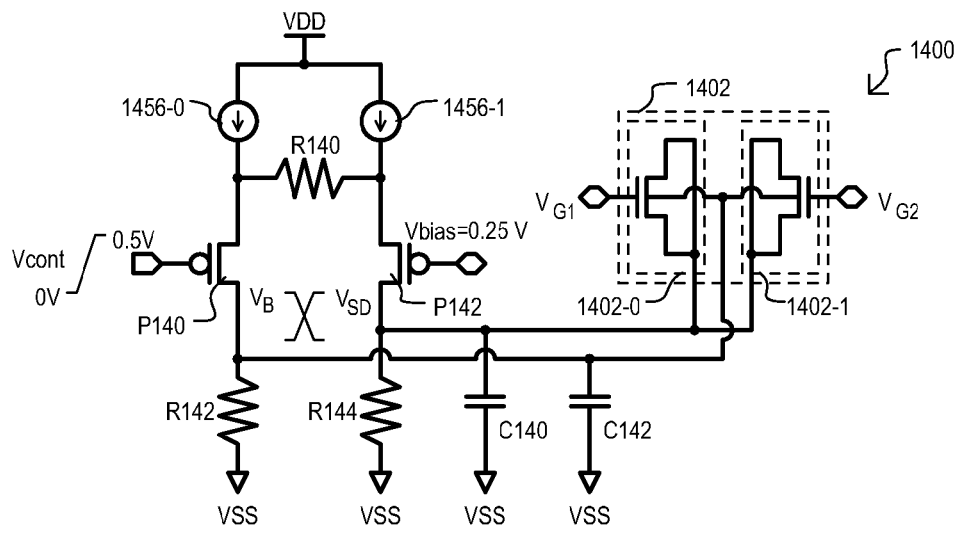
FIGS. 14A and 14B are block schematic diagrams showing a DDC based varactor driving circuit according to an embodiment.

FIG. 14A illustrates a varactor circuit 1400 according to an embodiment in a block schematic diagram. A varactor circuit 1400 can apply differential bias voltages $V_{SD}$ and $V_B$ to extend the capacitance tuning range of DDC I-MOS varactors 1402', in accordance with one embodiment.

As understood with reference to FIGS. 12, 13A and 13B, discussed above, the overall tuning range can be extended by applying capacitance tuning bias voltages to $V_{SD}$ and $V_B$ differentially. The circuit 1400 can include current sources 1456-0/1, resistors R140, R142, R144, p-channel transistors P140/P142, capacitances C140/C142 and DDC transistors 1402-0/1 configured in parallel as a capacitance element 1402. In one embodiment, transistors P140/P142 can be DDC transistors.

Current source 1456-0 can provide a bias current to a source of p-channel transistor P140, and current source 1456-1 can provide a bias current to a source of p-channel transistor P142. Resistance R140 can be connected between sources of transistors P140/P142. Transistor P140 can receive a bias control voltage (Vcont) at its gate, which in the very particular embodiment shown, can vary between 0 V and 0.5 V. A gate of transistor P142 can receive a bias voltage midway between that applied to the gate of P140 (which is 0.25 V in the embodiment shown). Resistance R142 and capacitance C142 can be connected between a drain of P140 and a low power supply VSS. Similarly, resistance R144 and capacitance C140 can be connected between a drain of P142 and low power supply VSS. Resistances R142 and R144 can be the same. Capacitances C140 and C142 can be the same.

DDC transistors 1402-0/1 can have source/drains commonly connected to a drain of transistor P142. Bodies (i.e., screening regions) of DDC transistors 1402-0/1 can be commonly connected to a drain of transistor P140. DDC transistors 1402-0/1 can form a capacitance element 1402 between nodes $V_{G4}$ and $V_{G2}$.

Varactor circuit 1400 can present a single-to-differential gain stage with the gain defined by 2*R142/R140. By adjusting the ratio of the resistors R142/R144 and R140, the rate of change for the bias voltages applied to nodes $V_{SD}$ and $V_B$ can be adjusted and the desired differential voltage swing can be developed between these two bias voltages. As shown by waveforms $V_B$ and $V_{SD}$, in operation, bodies of DDC transistors 1402-0/1 will receive a voltage $V_B$ that varies in an opposite manner to that applied to source drains ($V_{SD}$).

As understood from FIG. 13A, DDC I-MOS varactors 1402-0/1 application of opposing $V_{SD}$ and $V_B$ potentials can improve a quality factor Q of an oscillating circuit incorporating such varactors. Simulation results obtained from this differential biasing circuit 1400 show that a DDC I-MOS varactor can have a capacitance tuning range that is enhanced by as much as 45% compared to a conventional I-MOS varactor that uses a conventional MOS transistor and only one bias voltage $V_{SD}$.

Figure 14B:
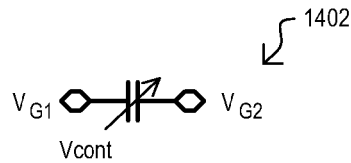

FIG. 14B shows an equivalent representation of capacitance element 1402 shown in FIG. 14A. By varying control signal (Vcont), a capacitance between nodes $V_{G1}$ and $V_{G2}$ can be varied.

Figure 15A:
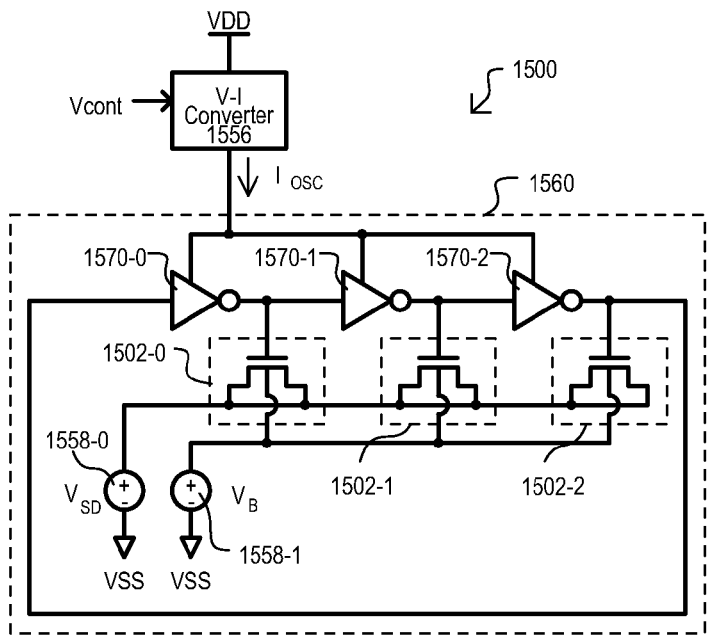
FIG. 15A is a block schematic diagram of a voltage controlled oscillator (VCO) having DDC based varactor elements according to an embodiment.

FIG. 15A illustrates a ring oscillator-type voltage controlled oscillator (VCO) 1500 that uses DDC varactor circuits as capacitive load elements in accordance with one embodiment. The VCO 1500 includes a voltage-to-current (V-I) converter (or a regulator) 1556 that provides a current $I_{OSC}$ to a current controlled ring oscillator (CCO) 1558. A CCO 1558 can include a number of stages (three shown as 1570-0 to -2) arranged in series with one another. A DDC I-MOS varactor can be connected as a load capacitance to one or more outputs of such stages. The very particular embodiment of FIG. 15 shows a DDC I-MOS varactor (1502-0 to -2) at outputs of each stage (1570-0 to -2). A voltage control signal $V_{CONT}$ can be used to set a coarse frequency for CCO 1558. A fine frequency control can be done through varactor tuning by changing the bias voltages ($V_B$ and $V_{SD}$) applied to the varactors via voltage sources 1558-0/1. In alternative embodiments, where the bias voltages ($V_B$ and $V_{SD}$) are generated by a single-to-differential gain stage, as illustrated in FIG. 14A, that applies differential bias voltages $V_B$ and $V_{SD}$ based on a bias control voltage, the varactor tuning can be changing the bias control voltage applied to the single-to-differential-gain stage.

In one embodiment, any or all of oscillator stages (e.g., 1570-0 to -2) can be formed from DDC transistors, such as those shown in FIG. 10A or 10B.

In one particular embodiment, a VCO 1500 can be used as part of a Clock and Data Recovery (CDR) circuit.

Figure 15B:
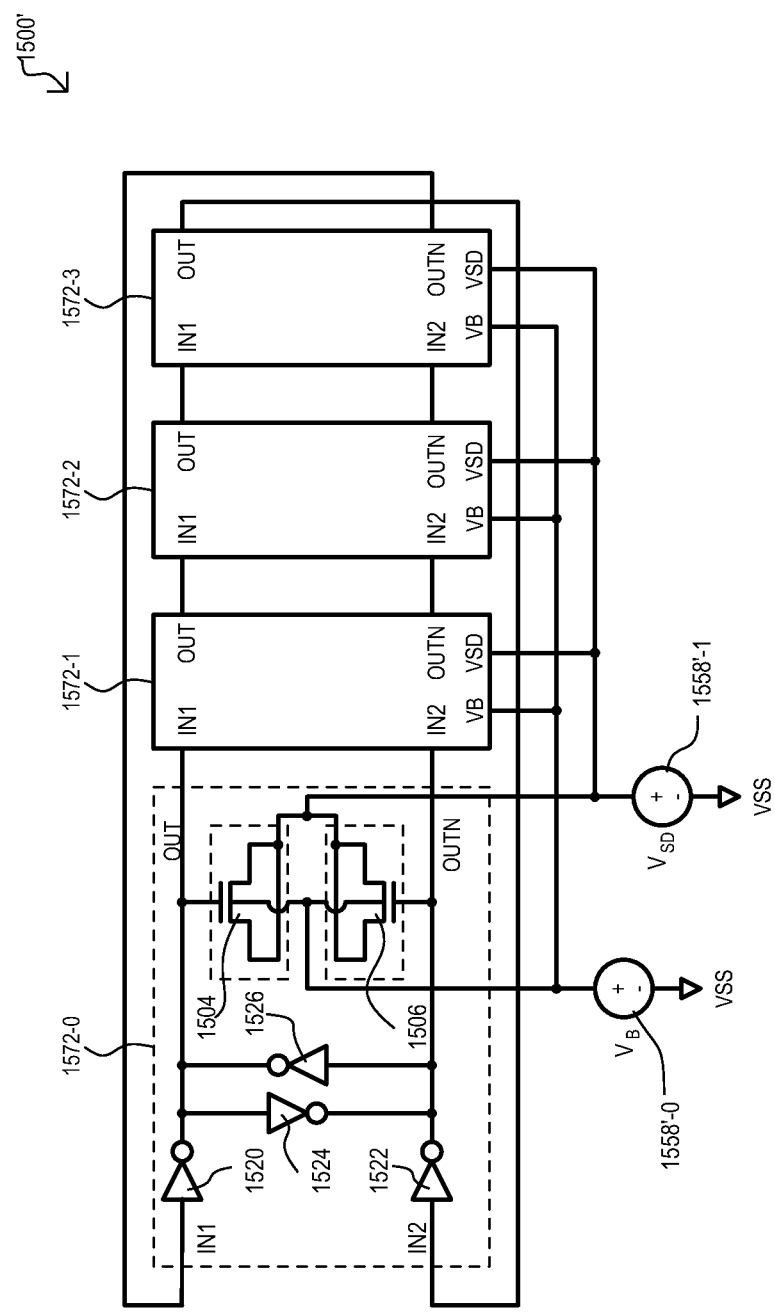
FIG. 15B is a block schematic diagram of a ring oscillator using DDC based varactor elements according to an embodiment.

FIG. 15B illustrates an alternative embodiment of a ring oscillator 1500' using differential delay element stages and DDC varactor circuits. The VCO 1500 includes differential delay elements (1572-0 to 3), where each stage has a non-inverting output (OUT) and an inverting output (OUTN). The differential delay element can be implemented using inverters 1520, 1522, 1524, and 1526 as illustrated in the figure. A DDC I-MOS varactor can be connected as a load capacitance to one or more outputs of such delay element stages. The very particular embodiment of FIG. 15B shows a DDC I-MOS varactor (1504 and 1506) coupled between the non-inverting and inverting outputs (i.e., between OUT and OUTN) of each delay element stage (1572-0 to -3). The frequency control of the ring oscillator 1500' can be done through varactor tuning by changing the bias voltages ($V_B$ and $V_{SD}$) applied to the varactors via voltage sources 1558'-0/1. In alternative embodiments, where the bias voltages ($V_B$ and $V_{SD}$) are generated by a single-to-differential gain stage as illustrated in FIG. 14A that applies differential bias voltages $V_B$ and $V_{SD}$ based on a bias control voltage, the varactor tuning can be changing the bias control voltage applied to the single-to-differential-gain stage.

In one embodiment, any or all of oscillator stages (e.g., 1572-0 to -3) can be formed from DDC transistors, such as those shown in FIG. 10A or 10B.

In one particular embodiment, a ring oscillator 1500' can be used as part of a Clock and Data Recovery (CDR) circuit.

Figure 16A:
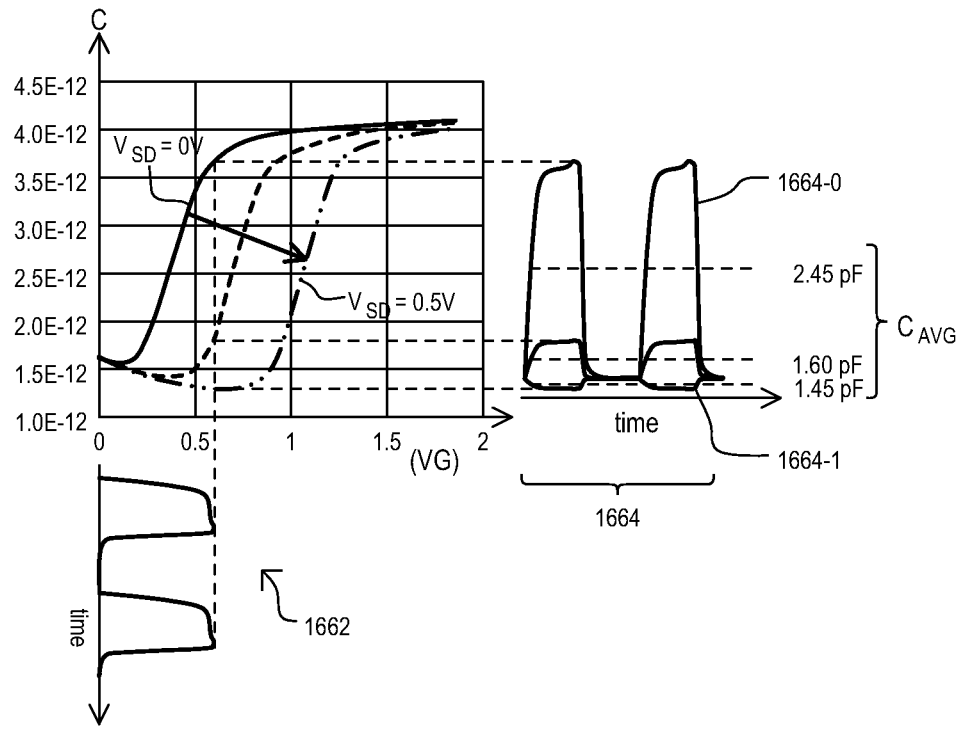
FIGS. 16A and 16B are graphs showing the impact of DDC based varactor elements on the performance of ring oscillator stages, according to embodiments.

FIG. 16A illustrates the C-V curves of a DDC I-MOS varactor for various values of bias voltage $V_{SD}$ and the resulting average capacitive load at the output node of a CCO stage, like that of FIG. 15A, in accordance with one embodiment. As described above, the bias voltages ($V_B$ and $V_{SD}$) can have an impact on the flat-band voltage of the DDC I-MOS varactor resulting in the shift of C-V curves as the MOS capacitor inversion point is changed.

As shown in FIG. 16A, the time domain waveforms of ring oscillator VCO (e.g., 1500) can behave like a pulse modulated signal as the signal oscillates up and down at each stage of the CCO 1558. In FIG. 16A, the oscillator stage output large signal time domain behavior 1662 is superimposed on the DDC I-MOS varactor C-V characteristics, to produce pulse shape time domain capacitance curves 1664 as shown in FIG. 16A. For the embodiment illustrated in FIG. 16A, the body bias voltage $V_B$=0 and the oscillation amplitude is 0.6 V. As illustrated in FIG. 16A, when this 0.6 V amplitude oscillating signal is applied to the DDC I-MOS varactor having the C-V curve shown for $V_{SD}$=0, the corresponding capacitance curve 1664-0 will have higher amplitude as compared to the capacitance curve for $V_{SD}$=0.5 V 1664-1. Therefore, the DDC I-MOS varactor has a higher average capacitance value for $V_{SD}$=0, and average capacitance value decreases with increasing bias voltage $V_{SD}$ (e.g., the average capacitance is 2.45 pF for $V_{SD}$=0, 1.45 pF for $V_{SD}$=0.5).

Figure 16B:
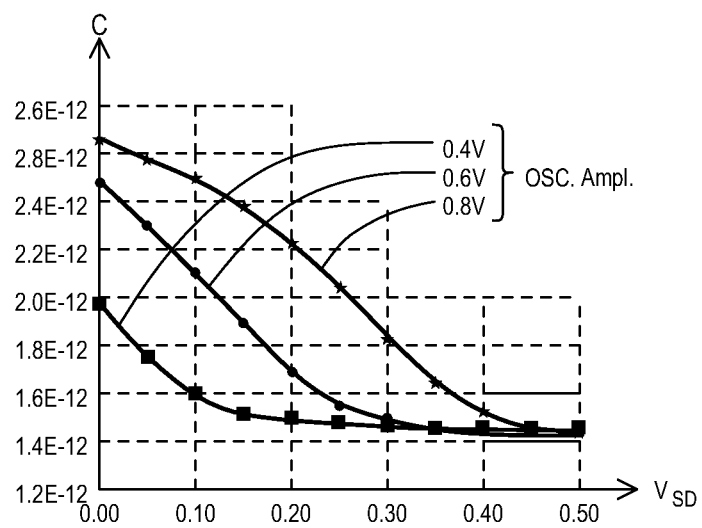

FIG. 16B illustrates plots of the average capacitance versus $V_{SD}$ as the oscillation amplitude is varied from 0.4 V to 0.8 V, in accordance with one embodiment. In alternate embodiments, increased variation of the average capacitance, i.e., increased capacitance tuning, can be obtained by changing the bias voltage $V_B$ in addition to changing $V_{SD}$, as would be understood from FIG. 13A.

Figure 17:
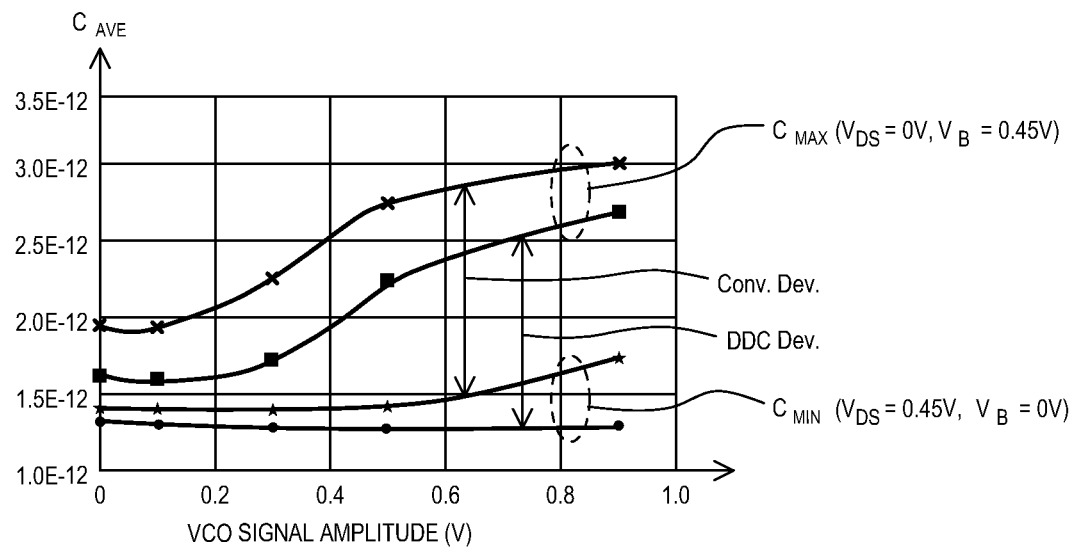
FIG. 17 is a graph showing the variation of capacitance of a DDC based varactor element on VCO signal amplitude, as compared to a conventional VCO, according to embodiments.

FIG. 17 illustrates a graph of the average capacitance of the DDC I-MOS varactor, and a conventional MOS varactor as a function of the signal amplitude of a VCO (e.g., 1500) as the bias voltages $V_{SD}$ and $V_B$ are changed between 0 volts and 0.45 volts. FIG. 17 illustrates that the DDC I-MOS varactor has an enhanced tuning range for the average capacitance as compared to the conventional I-MOS varactor. FIG. 17 shows that the average capacitance tuning range for the DDC I-MOS varactor becomes increasingly wider as the ring oscillator signal swing amplitude increases.

Figure 18:
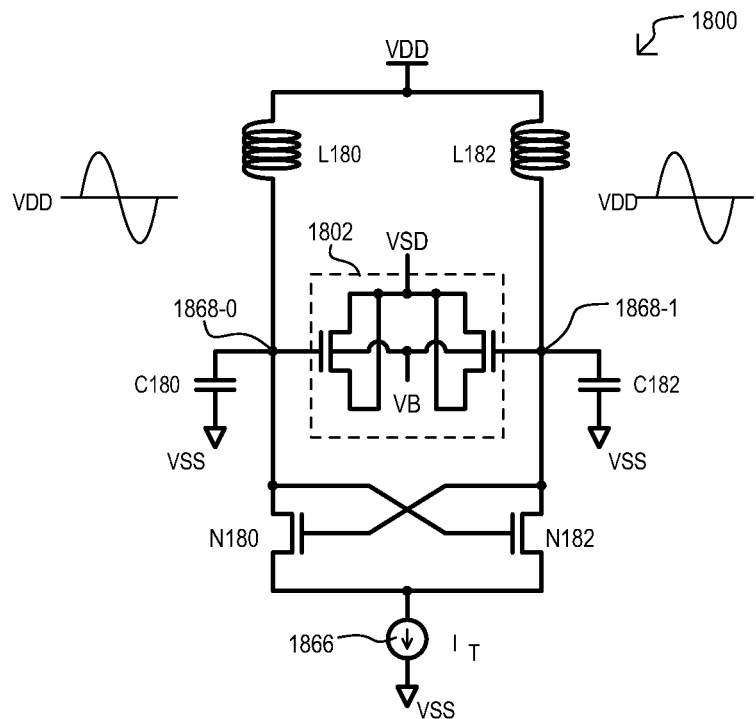
FIG. 18 is a block schematic diagram of an LC-type VCO having DDC varactor elements, according to an embodiment.

FIG. 18 is a schematic diagram for an LC-type VCO 1800 using DDC I-MOS varactors, in accordance with one embodiment. Since the common mode voltage of the LC VCO is biased at the power supply voltage VDD, the tuning range of the varactors in the LC VCO can be different from the tuning range of varactors in a ring oscillator VCO, such as that shown in FIGS. 15A and 15B.

In the embodiment shown, an LC-type VCO 1800 can include a varactor element 1802, inductors L180/L182, capacitances C180/C182, n-channel transistors N180/N182, and current source 1866. Varactor element 1802 can have a structure like that of FIG. 14A, having source-drain connections that can be biased with a voltage $V_{SD}$, and bodies (i.e., screening regions) that can be biased with a voltage $V_B$. Varactor element 1802 can be connected between oscillation nodes 1868-0/1.

Inductor L180 can be connected between a supply node VDD and oscillation node 1868-0, while inductor L182 can be connected between supply node VDD and oscillation node 1868-1. A load capacitance C180 can exist between oscillation node 1868-0 and a low supply node VSS, while a load capacitance C182 can exist between oscillation node 1868-1 and low supply node VSS.

Transistors N180/N182 can be cross-coupled between nodes 1868-0/1, each transistor having its gate connected to the other's drain. Sources of transistors N180/N182 can be connected to current source 1866. Current source 1866 can provide a bias current $I_T$.

Figure 19:
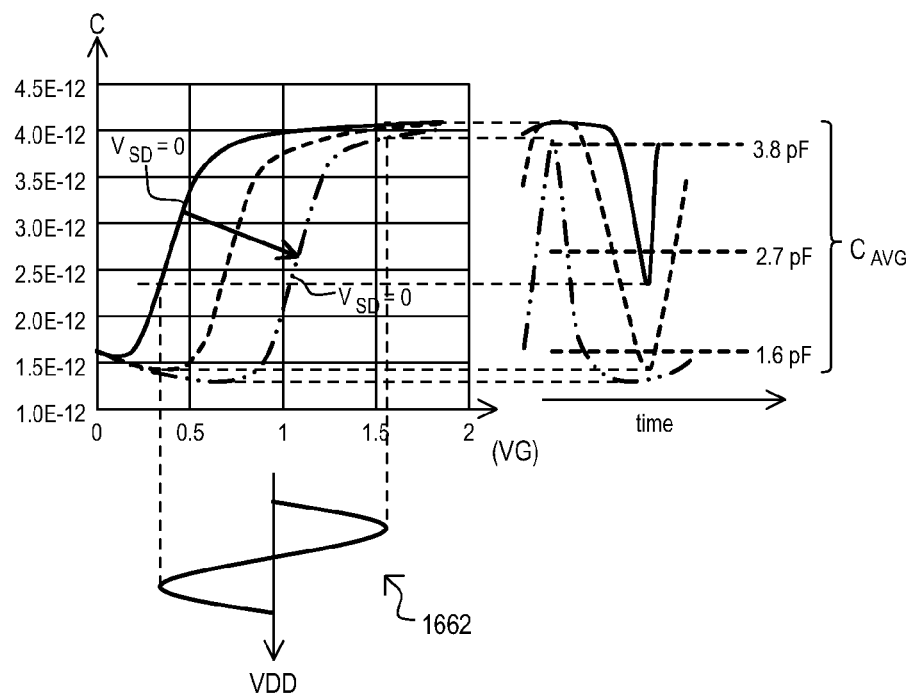
FIG. 19 is a graph showing the impact of DDC based varactor elements on the performance of the LC VCO, according to embodiments.

FIG. 19 illustrates the C-V curves of a DDC I-MOS varactor for various values of bias voltage $V_{SD}$ and resulting average capacitive load for a single cycle of the LC VCO 1800, in accordance with one embodiment. In the embodiment of FIG. 19, an oscillating signal 1972 having an amplitude of 0.6 volts (1.2 volts peak-to-peak) is applied to the C-V curves to obtain the average capacitance $C_{AVG}$. In FIG. 19, the average capacitance values for the DDC I-MOS varactor in the LC VCO circuit are shifted to higher values than the ring oscillator VCO shown in FIG. 16A, (i.e., 1.6 pF to 3.8 pF) because a higher gate voltage is applied to the DDC I-MOS varactors in the LC VCO circuit 1800.

Figure 20:
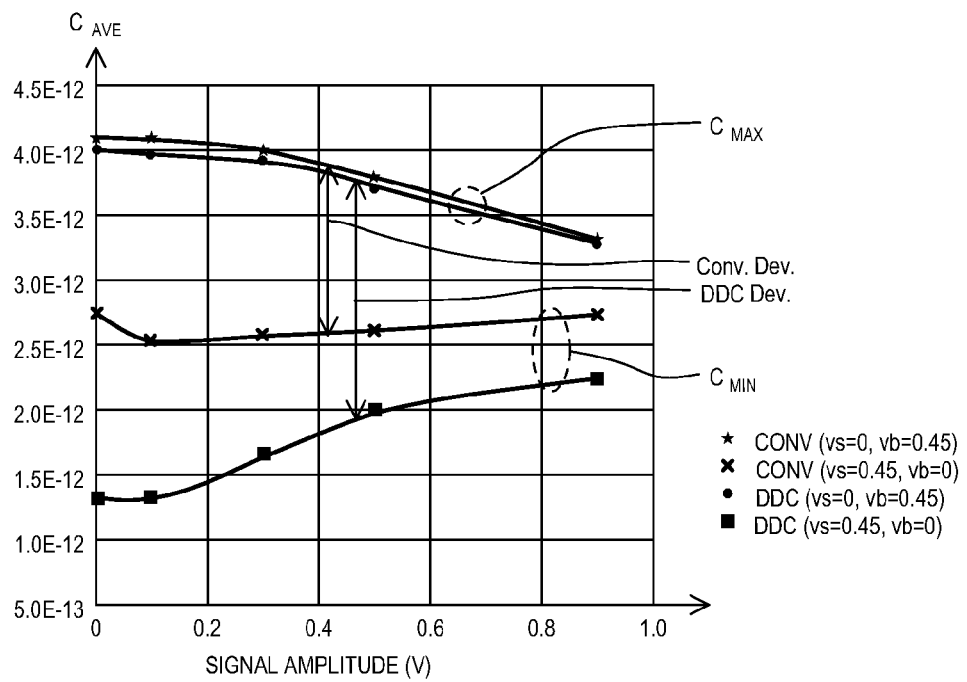
FIG. 20 is a graph showing the variation of capacitance of a DDC based varactor element on LC VCO signal amplitude, as compared to a conventional VCO, according to embodiments.

FIG. 20 illustrates graphs of the average capacitance of the DDC I-MOS varactor, and a conventional MOS varactor as a function of the LC VCO signal amplitude as the bias voltages $V_{SD}$ and $V_B$ are changed between 0 volts and 0.45 volts. FIG. 20 illustrates that the DDC I-MOS varactor has an enhanced tuning range for the average capacitance in comparison to the average capacitance tuning range for the conventional MOS varactor.

Figure 21:
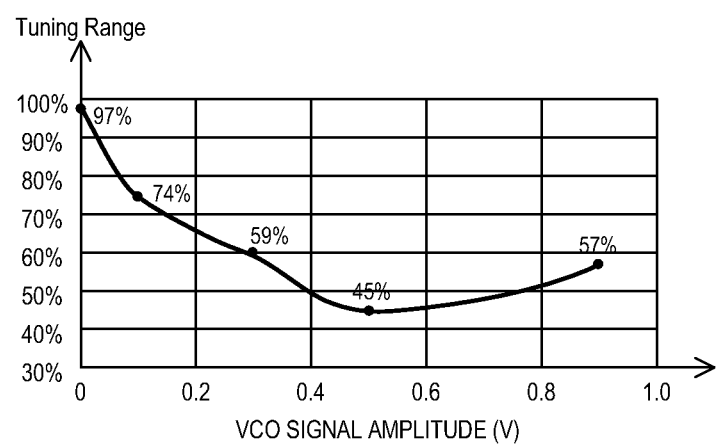
FIG. 21 is a graph showing the increase in tuning range for DDC varactor elements as a function of an LC VCO signal amplitude, as compared to a conventional VCO, according to embodiments.

FIG. 21 is a graph illustrating the enhancement of a tuning range for the DDC I-MOS varactor with respect to a conventional MOS varactor as a function of the LC VCO signal amplitude, in accordance with one embodiment. FIG. 21 illustrates that the DDC I-MOS varactor has a tuning range that is at least 45% greater than the conventional MOS varactor.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A circuit, comprising:
   at least one pair of deeply depleted channel (DDC) transistors having sources commonly coupled to a same current path; and
   a bias circuit configured to provide bias currents to the drains of the DDC transistors; wherein
   each DDC transistor includes a source and drain doped to a first conductivity type, a substantially undoped channel region extending laterally between the source and drain and contacting the source and drain, and a highly doped screening region of a second conductivity type, the highly doped screening region formed below the channel region and extending laterally between the source and drain.

2. The circuit of claim 1, wherein:
   the circuit comprises a current mirror circuit that provides an output current in response to a reference current;
   the pair of DDC transistors have gates commonly coupled to one another and to a drain of a first of the DDC transistors, and bodies commonly coupled to their gates; and
   the bias circuit is configured to provide the reference current to the drain of the first DDC transistor.

3. The circuit of claim 1, further including:
   the circuit comprises an operational amplifier circuit configured to amplify an input voltage received at input nodes;
   the pair of DDC transistors includes
     a first input DDC transistor with a gate coupled to a first input node, and
     a second input DDC transistor with a gate coupled to a second input node; and
   an output stage comprising a driver transistor coupled to an output node, the driver transistor being controlled in response to a current flowing through the first input DDC transistor.

4. The circuit of claim 3, wherein:
the bodies of the first and second input DDC transistors have bodies commonly coupled to a source of one of the input DDC transistors.

5. The circuit of claim 3, wherein:
the body of the first input DDC transistor is coupled to its gate; and
the body of the second input DDC transistor is coupled to its gate.

6. The circuit of claim 3, wherein:
the bias circuit comprises a current mirror circuit formed of at least one pair of mirror DDC transistors of a conductivity type opposite to that of the input DDC transistors, the mirror DDC transistors having gates commonly coupled to one another and to a drain of a first of the mirror DDC transistors, and bodies commonly coupled to their gates.

7. The circuit of claim 1, wherein:
the circuit is configured to operate with a power supply voltage of less-than-or-equal to 0.5 volts.

8. The circuit of claim 1, wherein:
the highly doped screening region has a dopant concentration of no less than $5 \times 10^{18}$.

9. The circuit of claim 1, wherein:
the highly doped screening region contacts the source and drain.

10. A circuit, comprising:
a plurality of inverting stages coupled to one another in series, an output of a last stage being coupled to an input of a first stage; and
each stage comprising at least two deeply depleted channel (DDC) transistors having gates coupled to a stage input, and configured to drive a stage output between two different voltages; wherein
each DDC transistor includes a source and drain doped to a first conductivity type, a substantially undoped channel region extending laterally between the source and drain and contacting the source and drain, and a highly doped screening region of a second conductivity type, the highly doped screening region formed below the channel region and extending laterally between the source and drain.

11. The circuit of claim 10, wherein:
each stage comprises a first DDC transistor of a first conductivity type and a second DDC transistor of a second conductivity type having drains commonly coupled to the stage output.

12. The circuit of claim 10, wherein:
each stage includes the bodies of the DDC transistors coupled to their gates.

13. The circuit of claim 10, further including:
a stage capacitance coupled between each stage, each stage capacitance comprising a load DDC transistor.

14. The circuit of claim 13, wherein:
each load DDC transistor has gate coupled to a first capacitance terminal and a source and drain commonly coupled to a second capacitance terminal.

15. The circuit of claim 13, wherein:
each stage capacitance comprises a varactor, with the body of each load DDC transistor coupled to a first voltage source and the source and drain of each load transistor coupled to a second voltage source; wherein
the capacitance of the varactor varies in response to the first and second voltage sources.

16. The circuit of claim 10, further including:
the circuit is configured to operate with a power supply voltage of less-than-or-equal to 0.5 volts.

17. The circuit of claim 10, wherein:
the highly doped screening region contacts the source and drain.

18. A circuit, comprising:
at least one varactor element comprising at least a first deeply depleted channel (DDC) transistor having a gate coupled to a first terminal, source and drain coupled to a second terminal, and a body coupled to a third terminal;
a first bias circuit coupled to apply a first bias voltage to the third terminal; and
a second bias circuit coupled to apply a second bias voltage to the second terminal; wherein
each DDC transistor includes a source and drain doped to a first conductivity type, a substantially undoped channel region extending laterally between the source and drain and contacting the source and drain, and a highly doped screening region of a second conductivity type formed below the channel region and extending laterally between the source and drain, and wherein a capacitance between the first and second terminals varies in response to the first and second bias voltages.

19. The circuit of claim 18, wherein:
each varactor element further includes a second DDC transistor having a gate coupled to a fourth terminal, source and drain coupled to the second terminal, and a body coupled to the third terminal; wherein
a capacitance between the first and fourth terminals varies in response to the first and second bias voltages.

20. The circuit of claim 18, further including:
a plurality of inverting stages coupled to one another in series, an output of a last stage being coupled to an input of a first stage; and
the at least one varactor element includes a plurality of varactor elements, each having a first terminal coupled to an output of each stage.

21. The circuit of claim 18, further including:
the varactor element further includes a second DDC transistor having a gate coupled to a fourth terminal, source and drain coupled to the second terminal, and a body coupled to the third terminal;
a first inductor coupled between the first terminal and a power supply terminal; and
a second inductor coupled between the fourth terminal and the power supply terminal.

22. The circuit of claim 18, wherein:
the at least one varactor element has a capacitance tuning range more than 15% greater than the tuning range of a varactor element formed with a same sized transistor that does not include a substantially undoped channel region or a highly doped screening region.

23. The circuit of claim 18, wherein:
the highly doped screening region contacts the source and drain.

* * * * *